US005552888A

United States Patent [19]
Sogard et al.

[11] Patent Number: 5,552,888
[45] Date of Patent: Sep. 3, 1996

[54] APPARATUS FOR MEASURING POSITION OF AN X-Y STAGE

[75] Inventors: Michael R. Sogard, Menlo Park; Martin E. Lee, Saratoga, both of Calif.

[73] Assignee: Nikon Precision, Inc., Belmont, Calif.

[21] Appl. No.: 349,733

[22] Filed: Dec. 2, 1994

[51] Int. Cl.⁶ .................................................. G01B 9/02
[52] U.S. Cl. ........................ 356/358; 356/401; 250/548
[58] Field of Search ............................. 356/345, 356, 356/358, 363, 399, 400, 401; 250/548

[56] References Cited

U.S. PATENT DOCUMENTS

| | | | |
|---|---|---|---|
| 4,278,352 | 7/1981 | Keller | 356/358 |
| 4,643,577 | 2/1987 | Roth et al. | 356/358 |
| 4,766,309 | 8/1988 | Kudo . | |
| 4,814,625 | 3/1989 | Yabu . | |
| 4,969,736 | 11/1990 | Slotwinski | 356/358 |
| 5,141,318 | 8/1992 | Miyazaki et al. . | |
| 5,146,284 | 9/1992 | Tabarelli et al. | 356/345 |

FOREIGN PATENT DOCUMENTS

| | | |
|---|---|---|
| 7-69141 | 7/1995 | Japan . |
| 1343636 | 1/1974 | United Kingdom . |

OTHER PUBLICATIONS

J. Bryan et al., *Design of a new error–corrected co–ordinate measuring machine*, Precision Engineering, vol. 1, pp. 125–128 (1979).

J. Bryan, *Design and Consturction of an Ultraprecision 84 inch Diamond turning Machine*, Precision Engineering, vol. 1, pp. 13–17 (1979).

J. H. Bruning, *Optical imaging for microfabrication*, J. Vac. Sci. Technol., 17(5), pp. 1147–1155, Sep./Oct. 1980.

*Nikon Technical Report: NSR Series Step–And–Repeat Exposure System General Information*, Apr. 1990, 16 page brochure.

R. Donaldson, et al., *Design and Construction of a Large, Vertical Axis Diamond Turning Machine*, Proc. of SPIE–The International Society For Optical Engineering, vol. 433, Aug. 24–26, 1983, pp. 62–67.

B. Krauskopf, *Diamond Turning: Reflecting Demands for Precision*, Manufacturing Engineering, vol. 92, No. 5, May 1984, pp. 89–100.

Primary Examiner—Frank Gonzalez
Assistant Examiner—Robert Kim
Attorney, Agent, or Firm—Skjerven, Morrill MacPherson, Franklin & Friel

[57] ABSTRACT

An interferometer used to measure distance to an object is provided with a laser sheath. The sheath encloses a substantial part of the measurement beam's path to provide a controlled environment which reduces environmental influences on the measured distance. The sheath is of variable length and responsive to a follower so as to maintain a sheath end nearest the object at a small distance from the object. An environmental controller controls the environment within the sheath. The environment within the sheath can be a vacuum or a suitable gas or gas mixture. A corrector can be used to compensate the interferometer's measured-distance signal for detected environmental characteristics to produce a corrected signal which indicates distance between the interferometer and the reflective surface. The apparatus and methods can be used to measure and control stage position in a projection-type wafer exposure system which is affected by variations in its atmospheric environment.

29 Claims, 19 Drawing Sheets

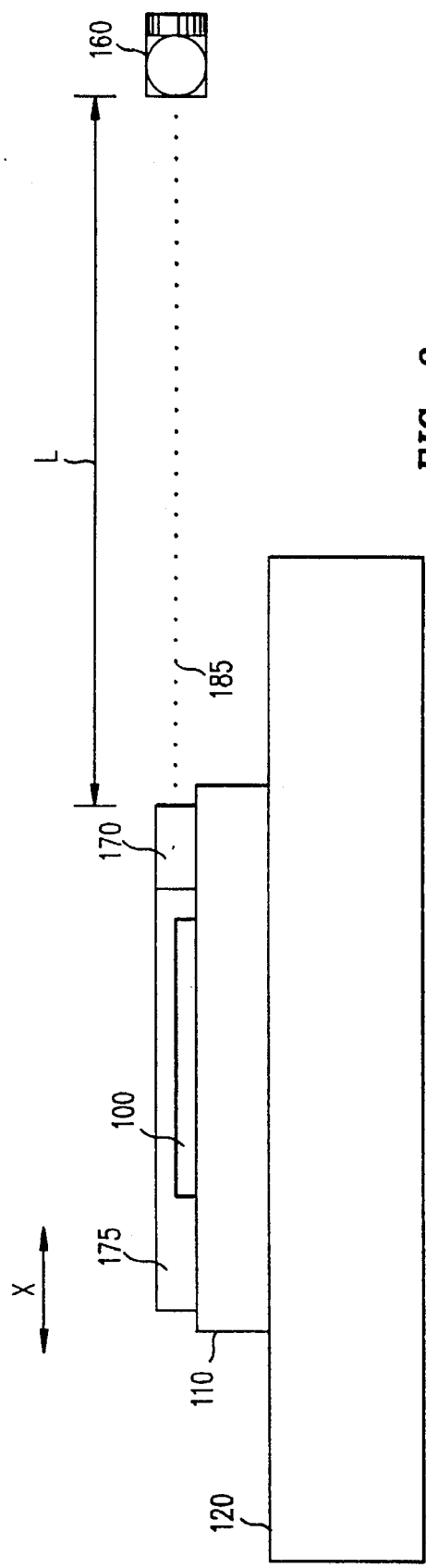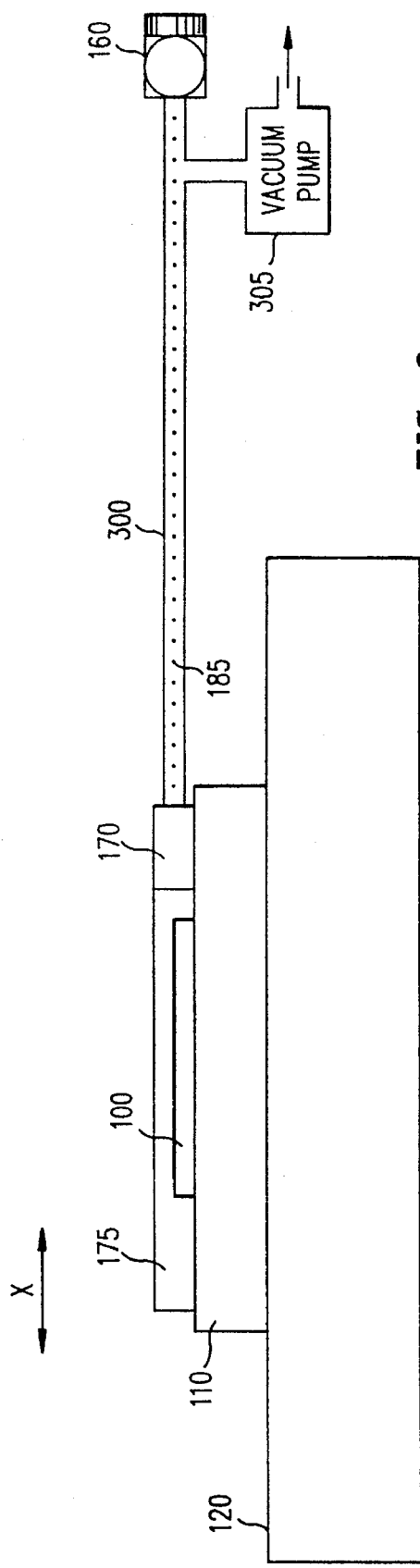

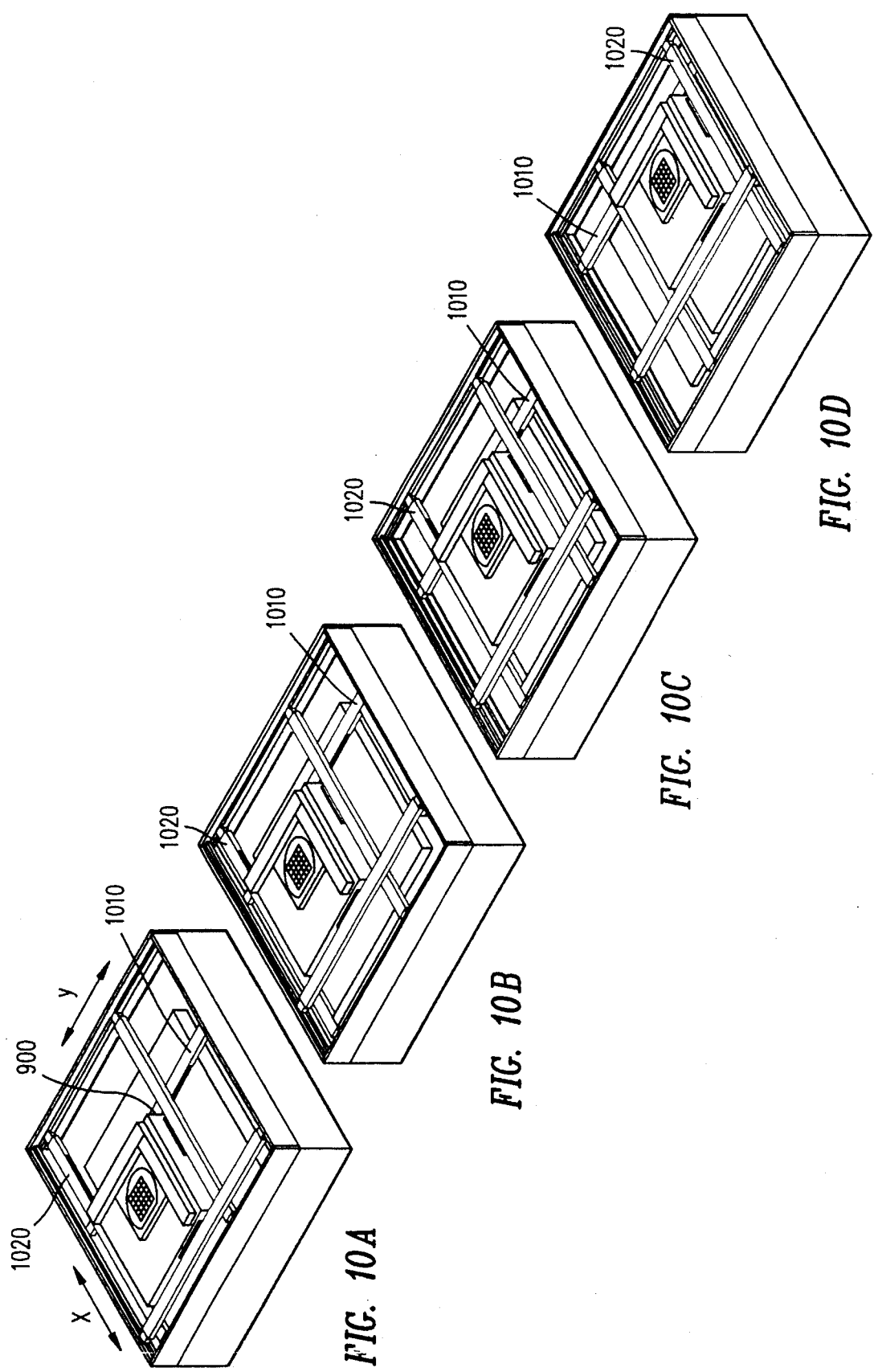

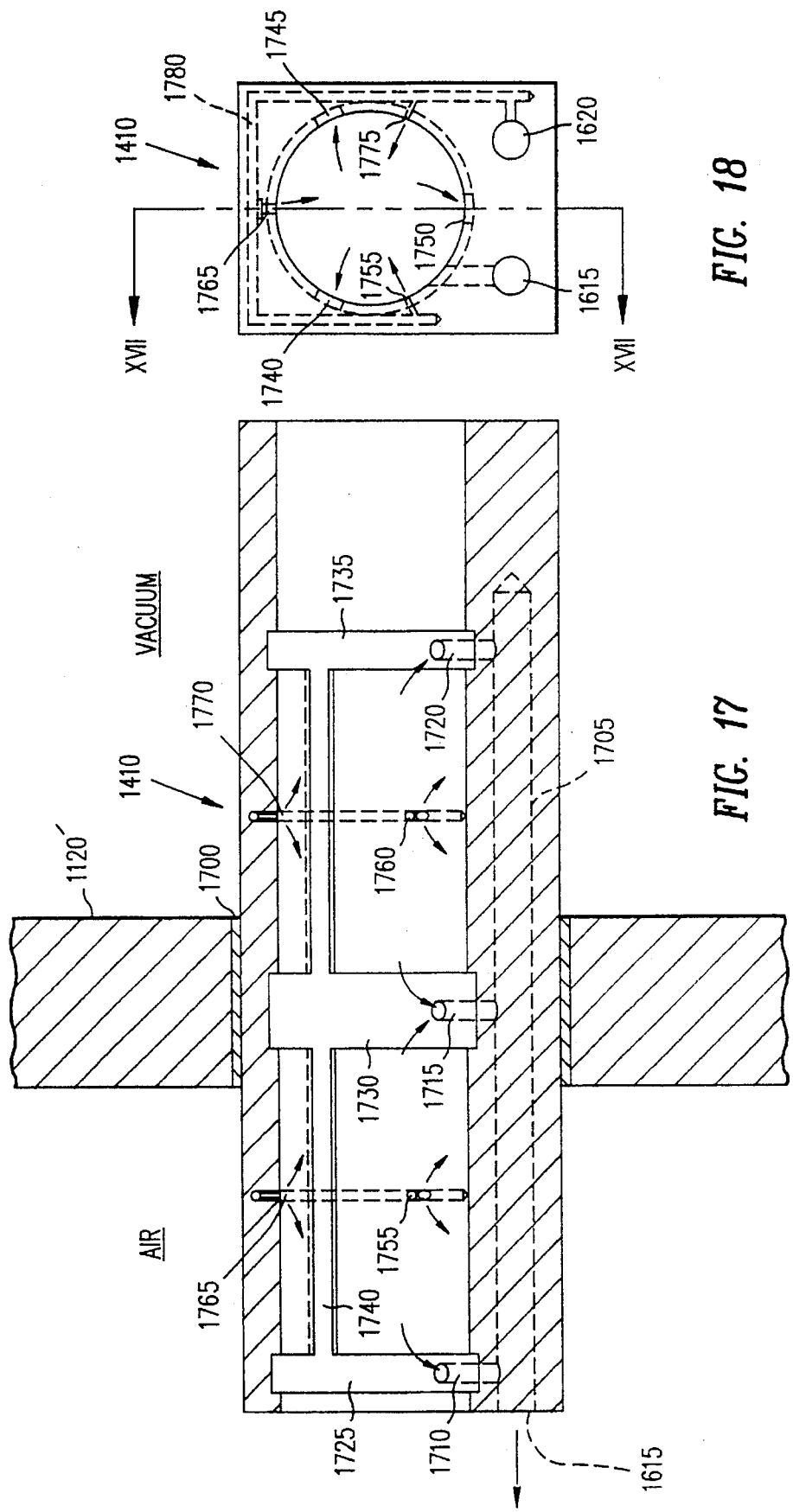

APPARATUS FOR MEASURING POSITION OF AN X-Y STAGE

BACKGROUND OF THE INVENTION

1. Field of the Invention

The invention relates to laser interferometer methods and apparatus, and more particularly to laser interferometers useful in positioning wafers in a semiconductor production system with improved isolation of the interferometer laser beam from environmental influences.

2. The Prior Art

FIG. 1 shows in simplified, schematic, perspective view a typical prior-art arrangement for positioning a semiconductor wafer 100. Wafer 100 is mounted in a chuck on an XY stage 105 having a bed 110 movable by operation of a controllable positioning device 115 along the X direction and a bed 120 movable by operation of a controllable positioning device 125 along the Y direction. The positioning devices and beds are mounted on a rigid platform 130. In the arrangement shown, stage 105 is used to position wafer 100 relative to an optical image produced by a light source 135, a reticle 140 and a projection lens assembly 145 in a step-and-repeat wafer exposure apparatus. The position of wafer 100 in each of the X and Y directions is measured by a laser interferometer system having a laser source 150, a beam splitter 155, interferometers 160 and 165, and mirrors 170 and 175. A laser beam 180 split by beam splitter 155 is supplied to interferometers 160 and 165. Interferometer 160 in turn splits the beam into a reference laser beam (not shown) and a measurement laser beam 185 which is applied to mirror 170 for measuring position of wafer 100 in the X direction. Interferometer 165 splits the beam into a reference laser beam (not shown) and a measurement laser beam 190 which is applied to mirror 175 for measuring position of wafer 100 in the Y direction. The measured position is fed back to a stage control circuit (not shown) which controls positioning devices 115 and 125 to position the wafer in a closed loop control system.

Known systems of this general type have the stage, wafer and optical system surrounded by atmospheric air, though typically in an air-conditioned environment to provide control of dust and air temperature. Even so, air temperature varies enough over the length of the measurement laser beams, over short periods of time, to introduce a significant error in the wafer-position measurement. These variations can result, for example, from heat-producing components such as positioners 115 and 125, light source 135, and/or laser source 150.

FIG. 2 illustrates the effect of environmental variation in position measurement. Distance L between interferometer 160 and mirror 170 is to be measured using a measurement laser beam 185 aligned in the X direction. Rather than directly measuring distance, interferometer 160 measures an optical path length OPL which is related to distance L and to the index of refraction $\eta$ of the air through which beam 185 passes by the relationship $$OPL = \eta L$$

Any variation in the index of refraction directly affects OPL and, with it, the apparent position of wafer 100. In situations where a differential interferometer is used, some compensation is possible if the reference beam can be located in an environment that is comparable to the measurement beam. This can compensate large-scale environmental changes but does not adequately compensate localized variations. For example, it has been calculated that to measure the apparent distance L of a 420 mm path length to within 1 nm, temperature and pressure of the air through which the measurement laser beam passes must be maintained to within 0.002° K. and 0.006 mm Hg, respectively. Such tolerances are not believed achievable with existing technology.

U.S. Pat. No. 4,814,625 describes a semiconductor wafer-exposure system similar to that of FIG. 1 in which air-conditioning devices are provided for blowing currents of air at a controlled temperature toward the stage along the measuring paths of the laser interferometer system in the X and Y directions. Such a system attempts to limit air temperature variations which can affect measurement accuracy. U.S. Pat. No. 5,141,318 describes a laser-interferometer measuring apparatus and method for positioning a wafer in a semiconductor production system. Temperature-controlled air is passed through a vent which blows a uniform, laminar flow of air over the length of the measurement laser beam.

In practice, the systems of these two patents have at least two major drawbacks. First, they are difficult to implement due to limited space in the vicinity of the stage in a real wafer-stepper apparatus. Second, the improvement in measurement accuracy is believed inadequate for the expected demands of next-generation semiconductor processes. While such arrangements can reduce to some degree the influence of air temperature and pressure variations on measurement accuracy, more effective isolation from environmental fluctuations is needed.

Electron-beam lithography systems are known in which a wafer is positioned using a stage, and in which the electron optics and the stage and wafer are all enclosed in a vacuum chamber. While a vacuum environment is required for operation of an electron beam system, it is impractical and even undesirable for a semiconductor production system. Construction and maintenance of a vacuum system large enough for a wafer-stepper system would be costly and complex. Vacuum pumps, seals, housing elements and the like would increase initial cost and take up costly production space. System maintenance would be hindered by the need to assure vacuum sealing during system operation and after each intervention. Air locks would be needed to avoid losing vacuum each time a new wafer is introduced, possibly limiting achievable production rates. The changed index of refraction would mandate a complete redesign of the complex optical exposure system.

Despite its other disadvantages, the use of a vacuum environment offers the advantage of improved interferometer measurement accuracy due to reduced environmental influences on the measurement laser beams.

SUMMARY OF THE INVENTION

In accordance with preferred embodiments of the invention, an interferometer used to measure distance to an object is provided with a laser sheath. The sheath encloses a substantial part of the measurement beam's path to provide a controlled environment (e.g., of vacuum or of a gas such as Helium) which reduces environmental influences on the measured distance. The sheath is of variable length and responsive to a follower for maintaining a sheath end nearest the object at a small distance from the object. An environmental controller controls the environment within the sheath. A corrector compensates the interferometer's measured-distance signal for detected environmental characteristics along the beam path to produce a corrected signal which indicates distance between the interferometer and the reflective surface (e.g., of a stage mirror). The apparatus and methods can be used to measure and control stage position in a step-and-repeat wafer exposure system, and in other applications requiring precise distance measurement.

In one embodiment, the sheath comprises a housing enclosing a portion of the beam path, the housing having a wall and a beam opening through the wall, and the sheath portion comprises an elongate hollow member extending through the beam opening and supported for movement relative to the wall in a direction generally parallel to the beam path. The sheath portion is supported in the beam opening by an air-guided bearing. An end of the sheath portion nearest the reflective surface is covered with a window which allows passage of the measurement beam between the controlled environment and the reflective surface. The follower varies the effective length of the sheath portion by displacing the sheath portion along the beam path to maintain the window at a substantially constant distance from the reflective surface. A gap sensor measures distance between the window and the reflective surface, a temperature sensor measures atmospheric temperature in the region of the gap, and a pressure sensor detects pressure within the controlled environment. The corrector is responsive to the gap sensor, the temperature sensor and the pressure sensor for compensating the measured-distance signal in dependence on air-gap length, air-gap temperature, pressure within the controlled environment and the index of refraction of the window.

In another embodiment an end of the elongate hollow member nearest the reflective surface is fitted with a bearing for maintaining the sheath portion at a substantially fixed spacing from the reflective surface. In this embodiment, no window is required. The bearing comprises a tip end having a face resiliently biased toward the reflective surface and having at least one orifice for expelling pressurized gas to maintain separation between the face and the reflective surface. In the case of a vacuum environment within the sheath, the vacuum pumping capacity of the system is sufficient to exhaust the gases entering the sheath.

In a further embodiment, the sheath portion comprises a telescoping assembly of elongate hollow members, the assembly being supported for telescoping movement in a direction generally parallel to the beam path. In yet another embodiment, the sheath portion comprises an elongate hollow member having a bellows of variable length, supported for extension and retraction in a direction generally parallel to the beam path.

These and other features of the present invention are described below with reference to the drawing figures, in which like components are indicated by like reference numerals.

BRIEF DESCRIPTION OF THE DRAWING

FIG. 2 illustrates the effect of environmental variation in position measurement in a prior art system;

FIG. 3 schematically shows a modification of the arrangement of FIG. 2 in accordance with the invention;

FIGS. 10A–10D are a sequence of perspective views showing operating positions of the stage of FIG. 9B;

FIG. 17 is an enlarged-scale, sectional view taken through line XVII—XVII of FIG. 18 and showing internal structure of an air-guided bearing in accordance with the invention;

FIG. 18 is an end view of the air-guided bearing in accordance with the invention, with hidden lines to show internal structure;

DETAILED DESCRIPTION

FIG. 3 shows an idealized modification of the arrangement of FIG. 2 for avoiding the influence of environmental variations on the apparent position of wafer 100. A sheath 300 surrounds measurement laser beam 185 and is evacuated by a vacuum pump 305. To measure the apparent distance L of a 420 mm path to within 1 nm in a vacuum, for example, the temperature and pressure of the air through which the measurement laser beam passes must be sensed to a tolerance of ±1.54° K. and ±0.00618 mm Hg, respectively. Such tolerances are readily achievable in a vacuum environment of ≦1.2 mm Hg, for example. If pumping capacity greatly exceeds leak rate it should be possible to achieve an absolute pressure low enough that no correction of optical path length is needed to compensate for residual gases in the sheath.

Figure 4:
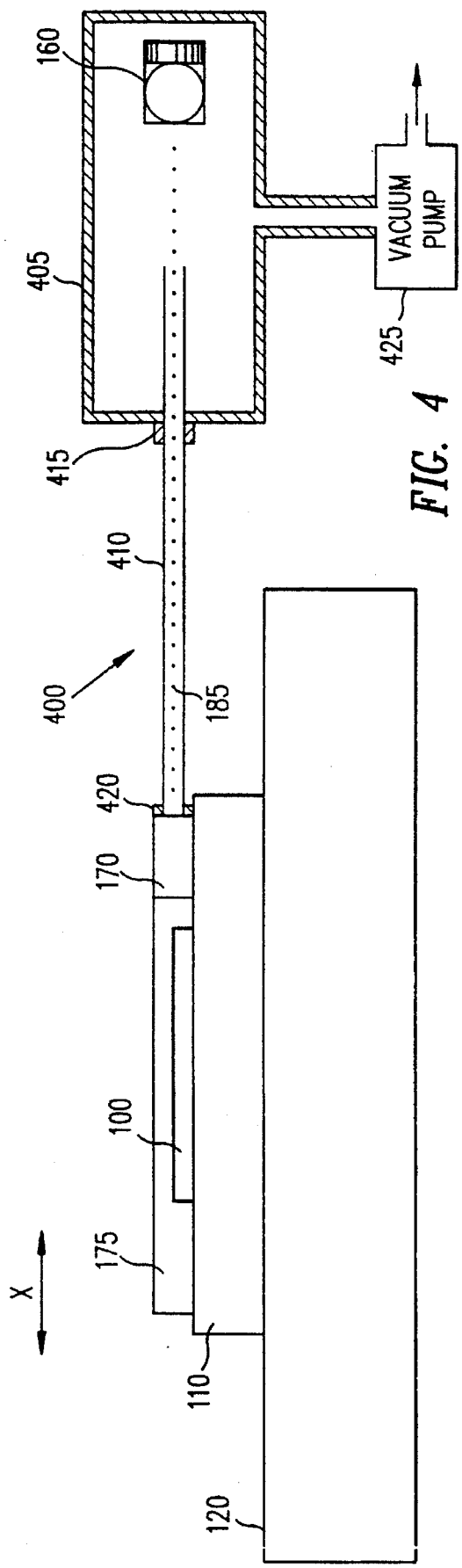
FIG. 4 schematically shows a further modification of the arrangement of FIG. 2 in accordance with the invention.

The arrangement of FIG. 3 is impractical for measuring the position of a stage which must be free to move in the X and Y directions, as mirror 170 must be free to travel relative to interferometer 160 in the X and Y directions without breaking vacuum or disturbing measurement laser beam 300. FIG. 4 shows an idealized modification of the arrangement of FIG. 3 in which a laser sheath 400 surrounding measurement beam 185 is made up of a fixed sheath portion 405, a movable sheath portion 410 which travels with stage bed 110 as wafer 100 is positioned along the X direction, a sliding seal 415 which allows movement of movable sheath portion in the X direction without loss of vacuum, and a sliding seal 420 which allows mirror 170 to slide relative to sheath portion 410 as bed 120 is moved in the Y direction. A vacuum pump 425 maintains vacuum within the sheath.

The arrangement of FIG. 4 is also not ideal, as it is undesirable for movable sheath portion 410 or seal 420 (or anything else) to contact any part of the precision stage. Among other things, such contact may apply a force which can affect stage positioning and which can cause the stage positioning motors to be continually under load. It is preferable to measure the position of the stage without any possibility of affecting stage position and without loading the stage drive motors.

Figure 5:
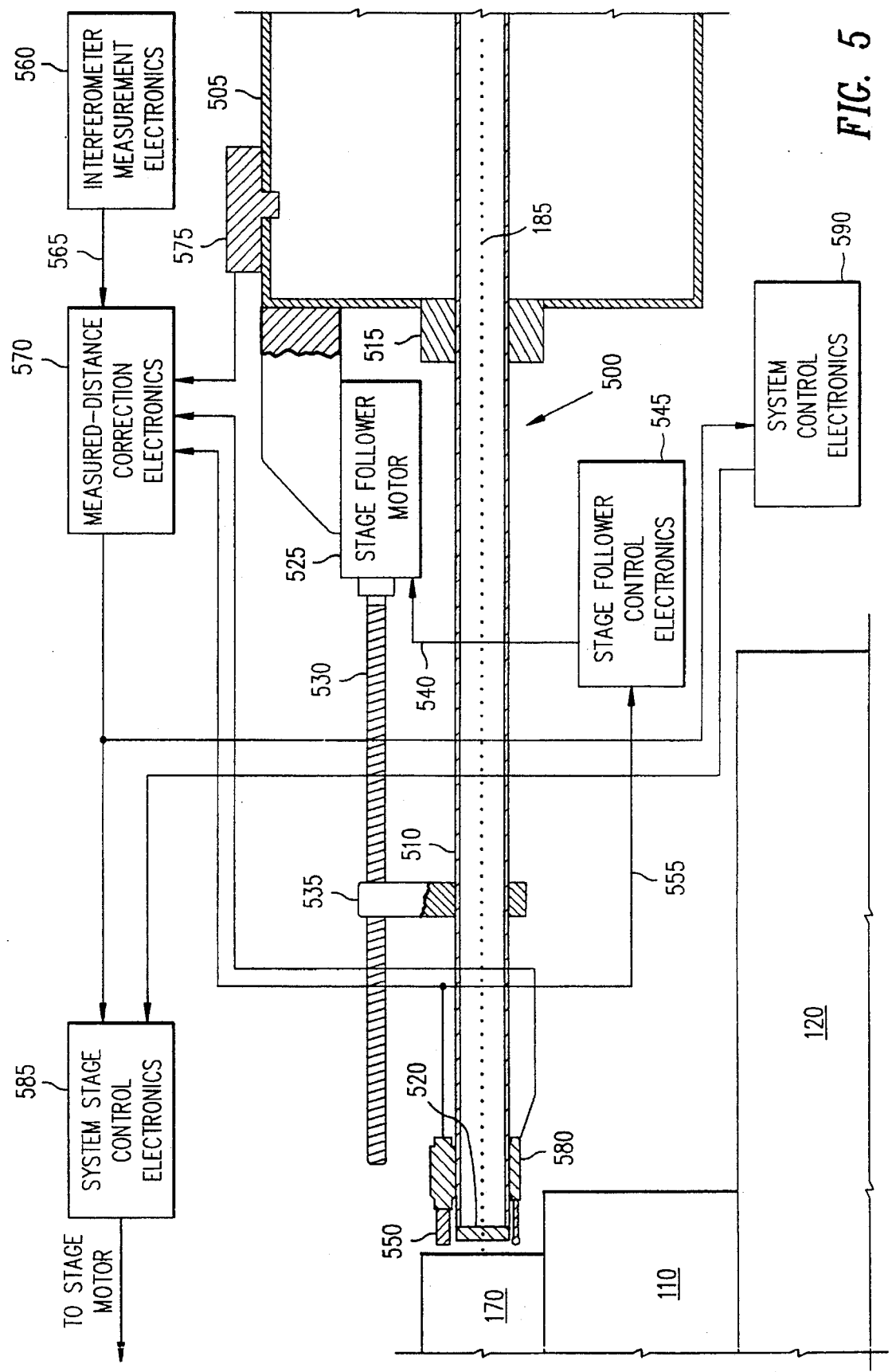
FIG. 5 is a partially cut-away elevation view schematically showing an arrangement for measuring and controlling position of a stage in accordance with the invention.

FIG. 5 shows a modified arrangement for measuring stage position without applying a force to the stage. A laser sheath 500 surrounding measurement beam 185 is made up of a fixed sheath portion 505, a movable sheath portion 510 which travels with stage bed 110 as wafer 100 is moved along the X direction, a sliding seal 515 which allows movement of movable sheath portion 510 in the X direction without loss of vacuum, and a window 520 through which measurement beam 185 passes to reach mirror 170. Movable sheath portion 510 is positioned in the X direction by a stage follower motor 525. Stage follower motor 525 drives a turn-screw 530 for moving a threaded follower nut 535 affixed to movable sheath portion 510. Stage follower motor 525 is operated by a control signal received via line 540 from stage follower control electronics 545. A proximity sensor 550 mounted adjacent window 520 supplies a gap-distance signal via line 555 to stage follower control electronics 545 so that the gap between stage mirror 170 and window 520 is maintained constant as movable sheath portion 510 follows movement of stage bed 110 in the X direction. A vacuum pump (not shown) maintains vacuum within sheath 500.

Interferometer measurement electronics 560 of interferometer 160 supply a raw measured-distance signal (representing the optical path length between interferometer 160 and mirror 170) via line 565 to measured-distance correction electronics 570. Measured-distance correction electronics 570 also receive a pressure signal from pressure sensor 575, a gap-air temperature signal from temperature sensor 580, and the gap-distance signal from proximity sensor 550. Measured-distance electronics 570 correct the raw measured-distance signal for the effects of window 520, of the air gap between window 520 and mirror 170, and of the pressure within sheath 500, and supply a corrected distance-measurement signal to system stage control electronics 585 and to system control electronics 590. System control electronics 590 supply stage control signals to system stage control electronics 585 for control of the X-axis stage motor.

Figure 6A:
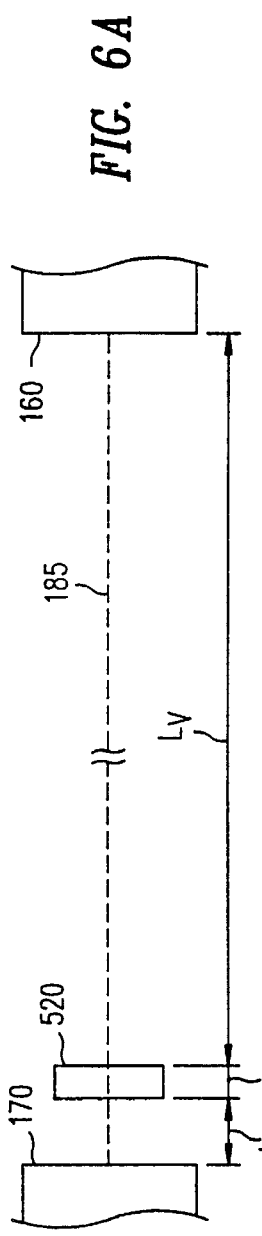
FIGS. 6A and 6B illustrate the relationship of optical path length to measured distance in preferred embodiments of the invention.

FIG. 6A shows schematically the path of measurement laser beam 185 in the arrangement of FIG. 5. Distance $L_V$ represents the measurement path length within the sheath from interferometer 160 to window 520, distance $L_W$ represents the measurement path length through window 520, and distance $L_A$ represents the measurement path length through the air gap. The optical path length from interferometer 160 to mirror 170 can be expressed as:

$$OPL = L_V \eta_V + L_W \eta_W + L_A \eta_A$$

where $\eta_V$ is the index of refraction of the vacuum environment within the sheath, $\eta_W$ is the index of refraction of the window material and $\eta_A$ is the index of refraction of the air gap.

Figure 6B:
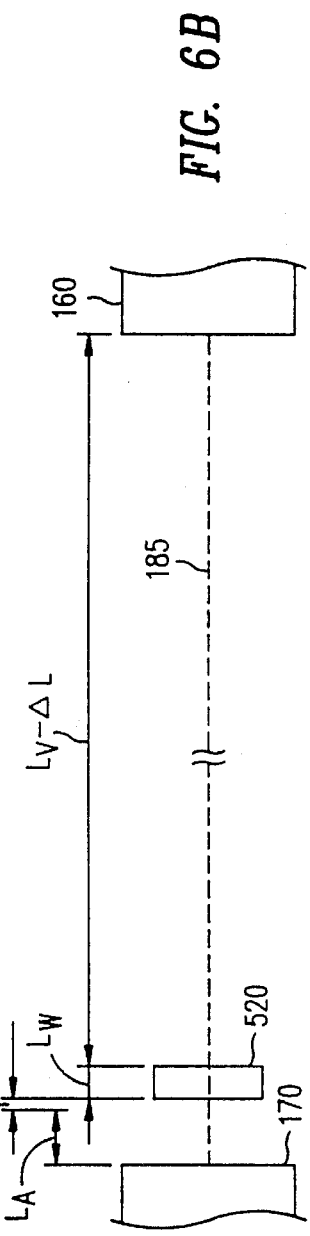

FIG. 6B shows schematically the effect of variation in the air-gap path length by an amount ΔL, which can occur if the stage follower does not perfectly follow movement of mirror 170. The optical path length can be expressed as:

$$OPL = (L_V - \Delta L)\eta_V + L_W \eta_W + (L_A + \Delta L)\eta_A$$

or $$OPL = L_A \eta_A + L_W \eta_W + L_V \eta_V + \Delta L(\eta_A - \eta_V)$$

If distance ΔL and indices $\eta_A$ and $\eta_V$ are known precisely, the effect of variation in the air-gap path length can be compensated. Distance A L is determined by proximity sensor 550, which can be an inductive or capacitive sensor. For example, it is believed that distance ΔL can be determined to within about 3.4 μm using a suitable position sensor such as a series SMU-9000 sensor from Kaman Instrumentation Corporation of Colorado Springs, Colo. Index $\eta_A$ varies mainly with changes in ambient temperature, and is compensated using the output signal from temperature sensor 580. Index $\eta_V$ varies mainly with changes in pressure within sheath 500, and is compensated using the output signal from pressure sensor 575.

Figure 7:
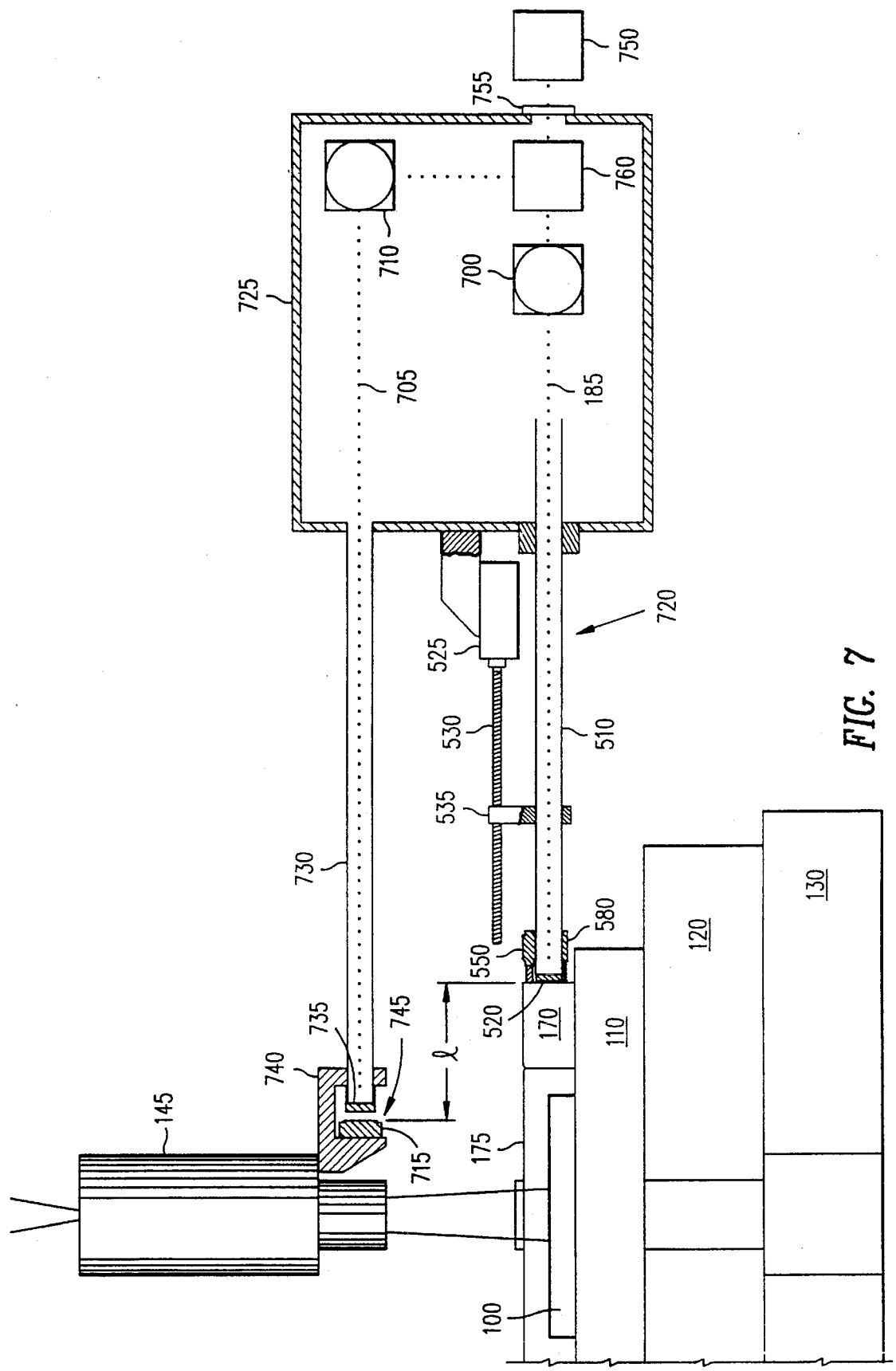
FIG. 7 is a partially cut-away elevation view of a modified version of the arrangement of FIG. 5 as installed in a photolithography system in accordance with the invention.

FIG. 7 shows a modified version of the arrangement of FIG. 5 as installed in a photolithography system. A wafer 100 is to be positioned relative to an image from projection lens assembly 145. An interferometer 700 emits a measurement laser beam 185, and an interferometer 710 emits a reference laser beam 705 which is directed at a mirror 715 mounted on the housing of lens assembly 145. A sheath 720 comprises a movable sheath portion 510, a housing 725 and a fixed sheath portion 730. Movable sheath portion 510 encloses the path of measurement laser beam 185 up to window 520. Fixed sheath portion 730 encloses the path of reference laser beam 705 up to window 735. Fixed sheath portion 730 is held in position by a bracket 740 such that an air gap 745 is maintained between window 735 and mirror 715. Air gap 745 is set equal to the nominal air gap between window 520 and mirror 170, so that reference laser beam 705 is subjected to virtually the same optical-path influences as is measurement laser beam 185. The apparent distance between interferometer 700 and mirror 170 is unaffected by any variations which affect the optical path of both beams. Distance ∫ between mirror 715 and mirror 170 varies with movement of stage bed 110. The system is preferably designed such that distance ∫ is approximately zero when stage bed 110 is in the center of its range of travel. The beam from splitter 155 is supplied to interferometer via a mirror 750, a window 755, and a splitter 760.

Figure 8:
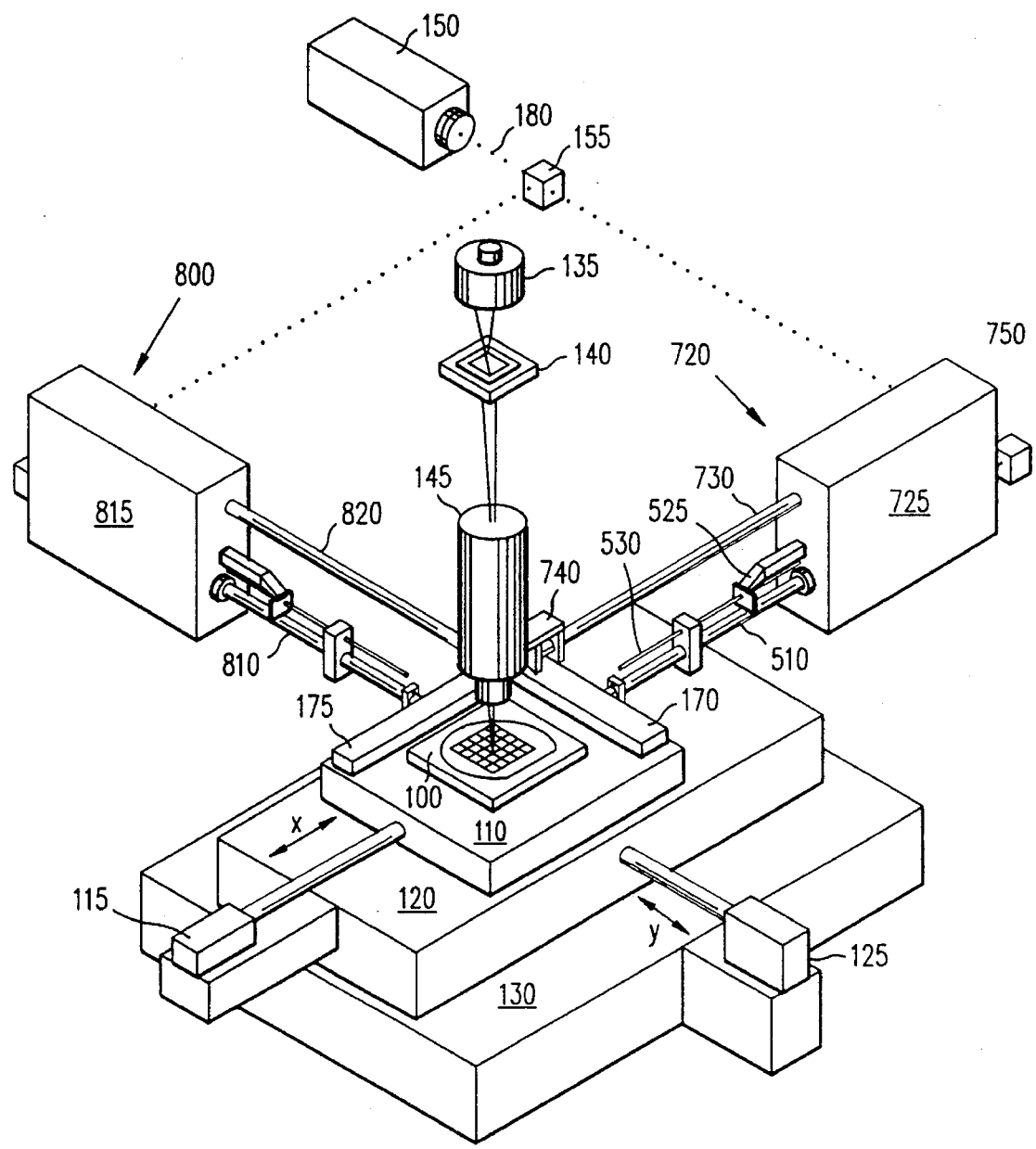
FIG. 8 is a perspective view of a wafer exposure apparatus having a pair of interferometer systems in accordance with the invention.

FIG. 8 shows the installation of a pair of interferometer systems like that of FIG. 7 in a wafer exposure system having an XY stage. In addition to X-axis sheath 720, a Y-axis sheath 800 comprises a movable sheath portion 810, a housing 815 and a fixed sheath portion 820. Movable sheath portion 810 encloses most of the path of a Y-axis measurement beam 190. Fixed sheath portion 820 encloses most of the path of a Y-axis reference beam (not shown) comparable to reference beam 705.

Figure 1:
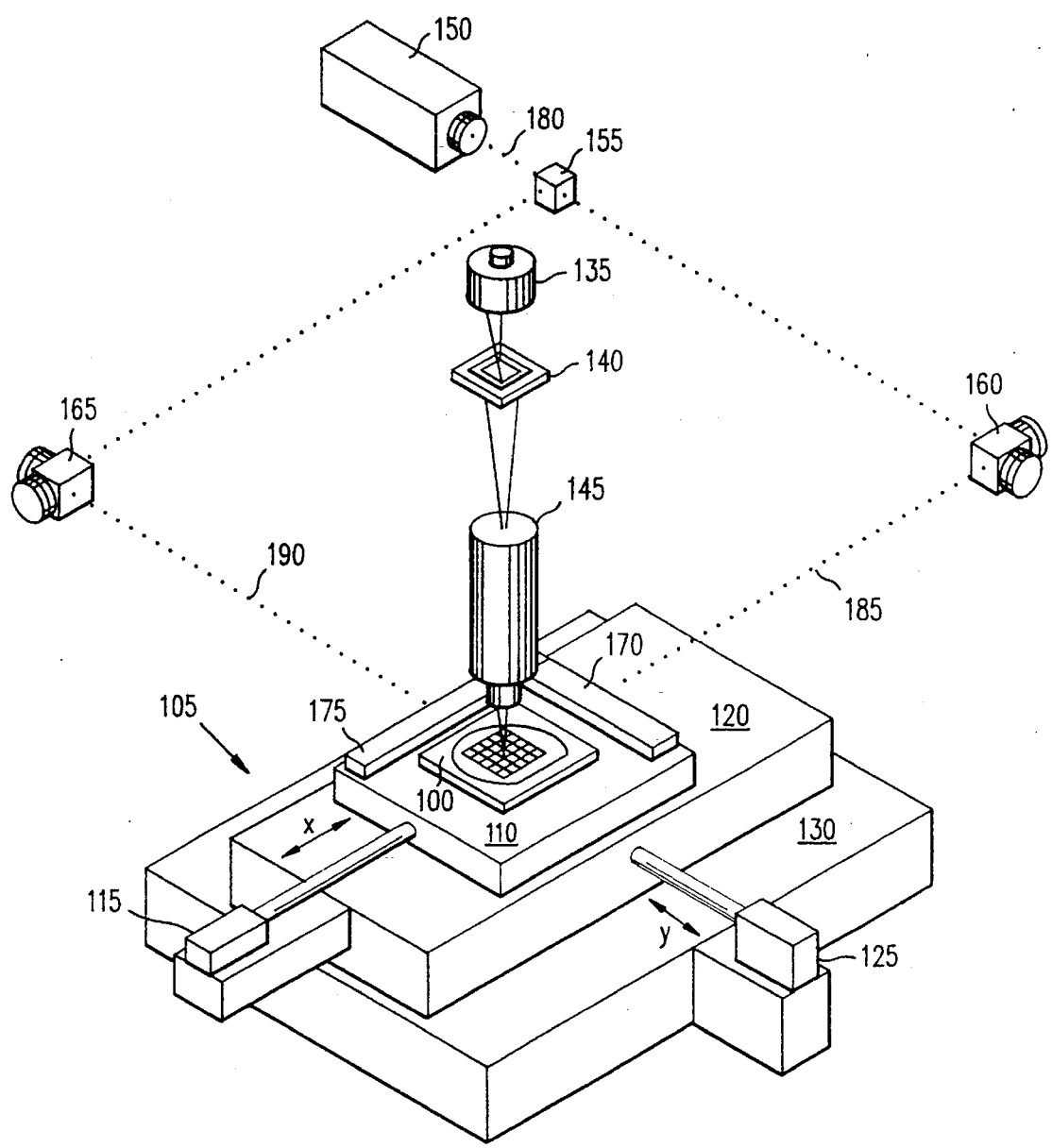
FIG. 1 shows in schematic, perspective view a typical prior-art arrangement for positioning a semiconductor wafer 100.

Laser sheaths in accordance with the invention are useful not only with traditional stage systems of the kind shown in FIG. 1. They are also useful, for example, with a guideless XY stage of the kind disclosed in U.S. patent application Ser. No. 08/221,375, filed Apr. 1, 1994, entitled "Electro-Mechanical Alignment and Isolation Method and Apparatus," the content of which is incorporated herein by this reference.

Figure 9A:
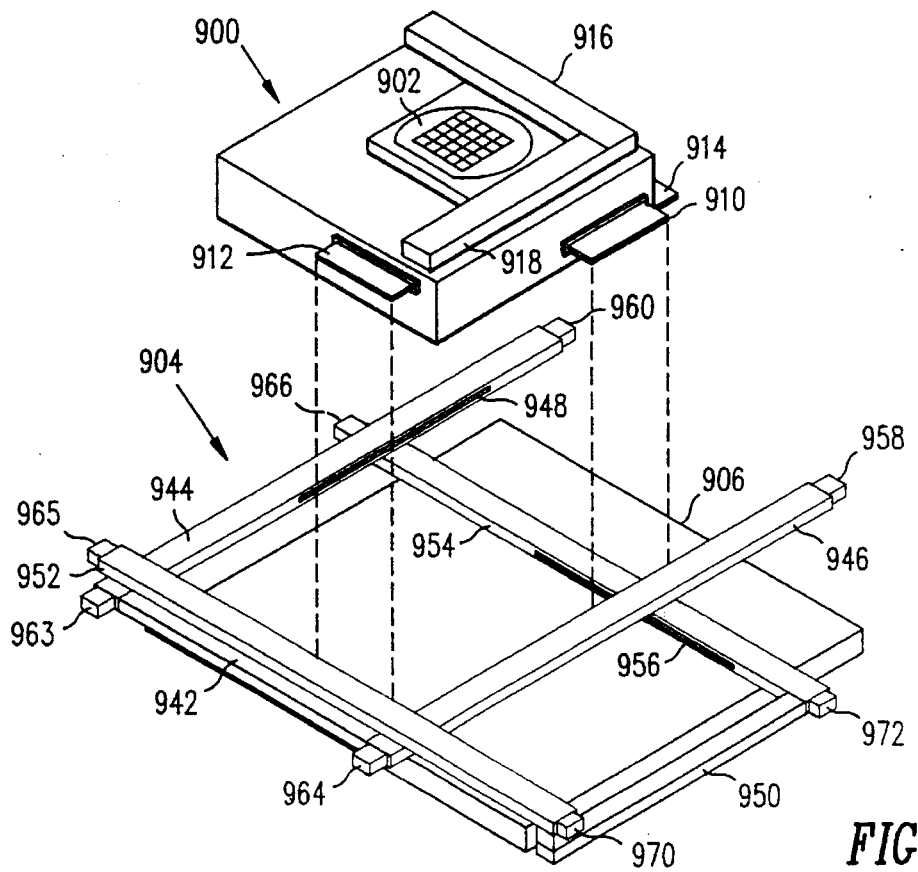
FIG. 9A is a partial, exploded, perspective view of parts of a guideless stage.
Figure 9B:
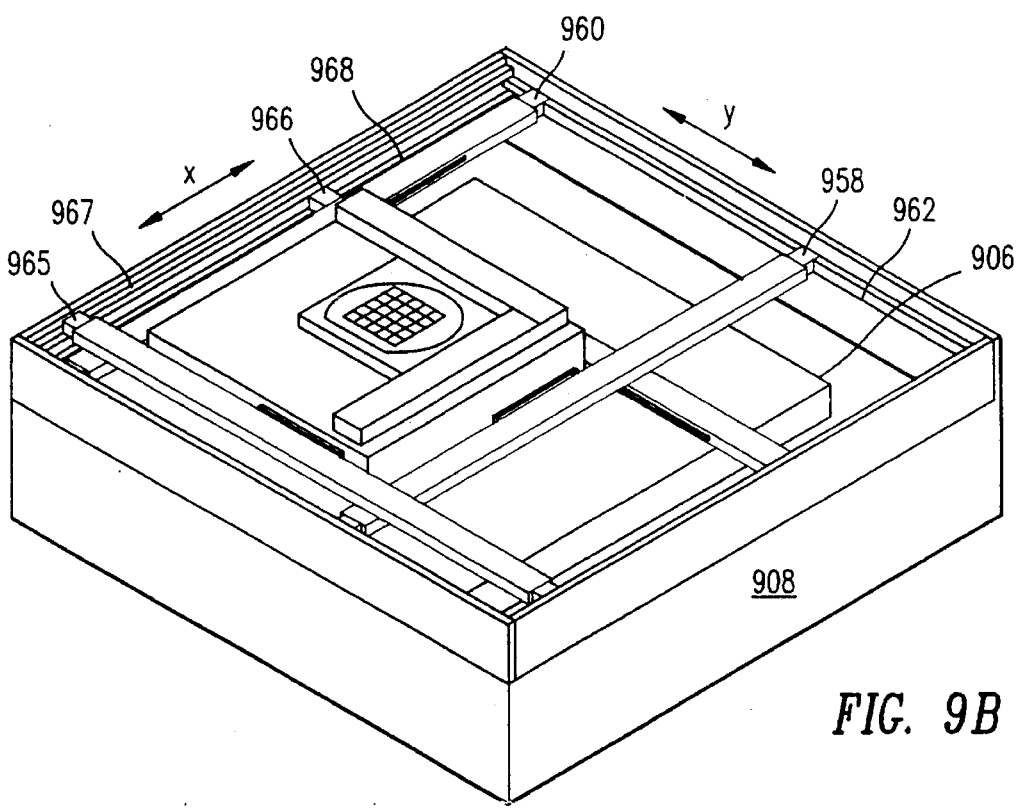
FIG. 9B is an assembled, perspective view of a guideless stage.

FIG. 9A is an exploded, perspective view of portions of a guideless stage. A stage 900 carries a wafer 902. A follower assembly 904 surrounds stage 900. As shown in the assembled, perspective view of FIG. 9B, stage 900 is supported above an air-bearing plate 906 on a cushion of air provided by an air/vacuum bearing. Air bearing plate 906 is supported by a base 908. Stage 900 carries magnetic drive coils of linear drive motors used for moving stage 900 in an X–Y plane; a coil 910 forms part of one of two linear drive motors for moving stage 900 in the X direction and coils 912 and 914 form part of linear drive motors for moving stage 900 in the Y direction. Stage 900 also carries mirrors 916 and 918 for determining position in the X and Y directions and rotational orientation Θ about the Z-axis with laser interferometers.

Stage 900 is followed closely by an X follower and a Y follower. The Y follower includes a cross member 942 connected to a pair of spaced apart arms 944 and 946. Arm 944 has a drive track 948 which cooperates with a coil (not shown) of stage 900 to form a first linear motor. Arm 946 has a drive track (not shown) which cooperates with coil 910 to form a second linear motor. The X follower includes a cross member 950 connected to a pair of spaced-apart arms 952 and 954. Arm 952 has a drive track (not shown) which cooperates with coil 912 to form a third linear motor. Arm 954 has a drive track 956 which cooperates with coil 914 to form a fourth linear motor.

Figure 14:
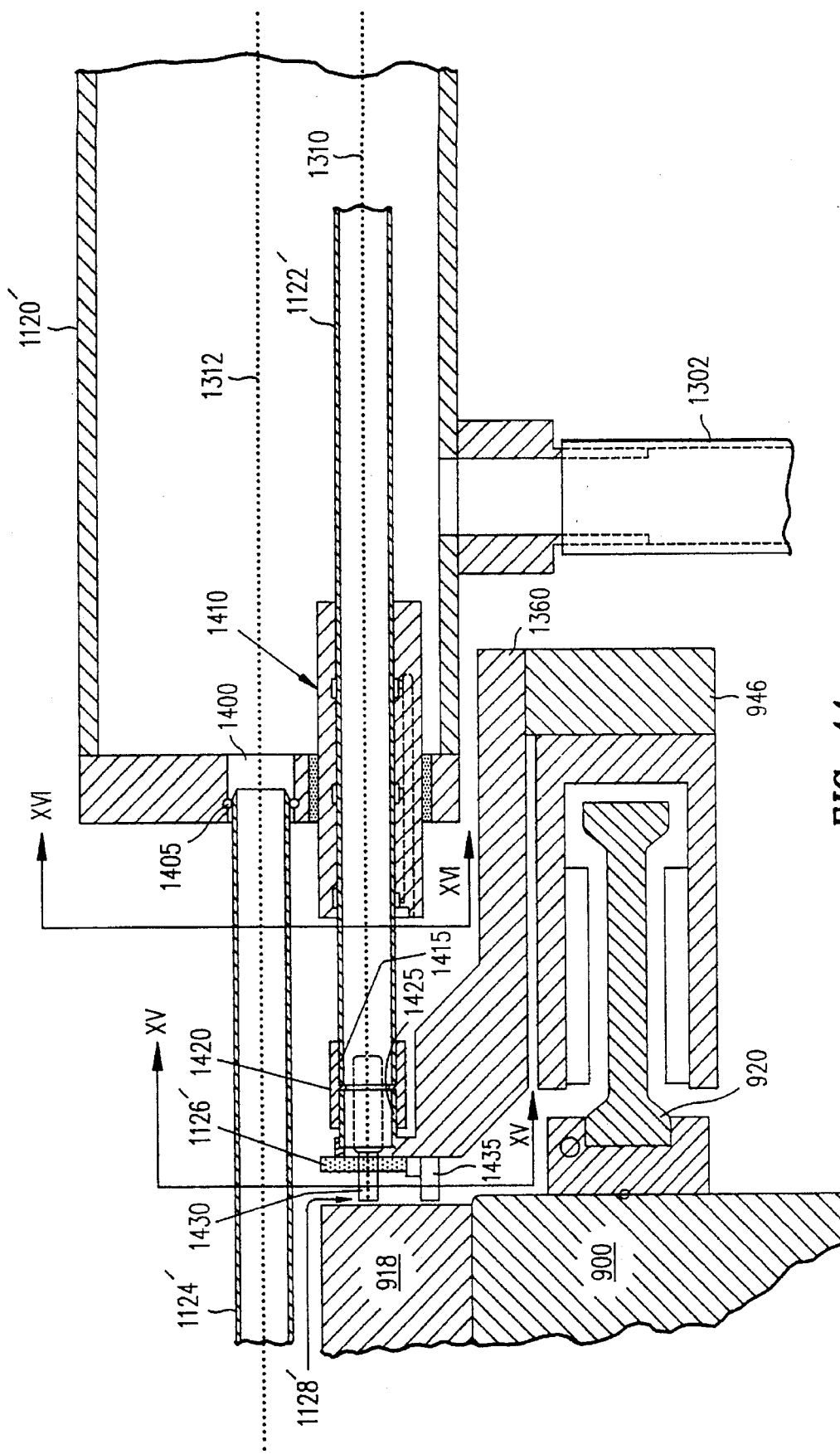
FIG. 14 is an enlarged-scale view showing details of a portion of FIG. 13.

The X follower and Y follower are supported on a reaction frame. The reaction frame can be supported independently of base 908. Ends 958 and 960 of arms 946 and 944 ride on a rail 962 of the reaction frame, while ends 963 and 964 of arms 944 and 946 ride on an opposing rail (not shown) of the reaction frame. A drive mechanism (not shown) moves the Y follower in the Y direction. Ends 965 and 966 of arms 952 and 954 ride on rails 967 and 968 of the reaction frame, while ends 970 and 972 ride on opposing rails (not shown) of the reaction frame. A drive mechanism (not shown) moves the X follower in the X direction. The drive mechanisms used to move the X and Y followers are used for coarse positioning and can thus be non-precision devices such as drive screws or drive motors using roller guides. While the linear drive motors move stage 900, the X and Y followers maintain themselves at a small distance from stage 900 without contacting stage 900. The linear-motor coils of stage 900 ride inside the drive tracks of the followers, but do not physically contact the followers or anything else. See, for example, the detail view of FIG. 14 showing coil 920 within (but not touching) follower arm 946.

FIGS. 10A–10D are a sequence of perspective views showing manipulation of the X and Y followers as stage 900 moves around. From FIG. 10A to FIG. 10B, X follower 1010 moves in the X direction to closely follow stage 900 as it travels in the X direction. From FIG. 10B to FIG. 10C, Y follower 1020 moves in the Y direction to closely follow stage 900 as it travels in the Y direction. From FIG. 10A to FIG. 10D, stage 900 moves from one extreme position to the opposing extreme position in the X and Y directions. Whatever the position of the stage, the X and Y followers follow in close proximity.

Figure 11:
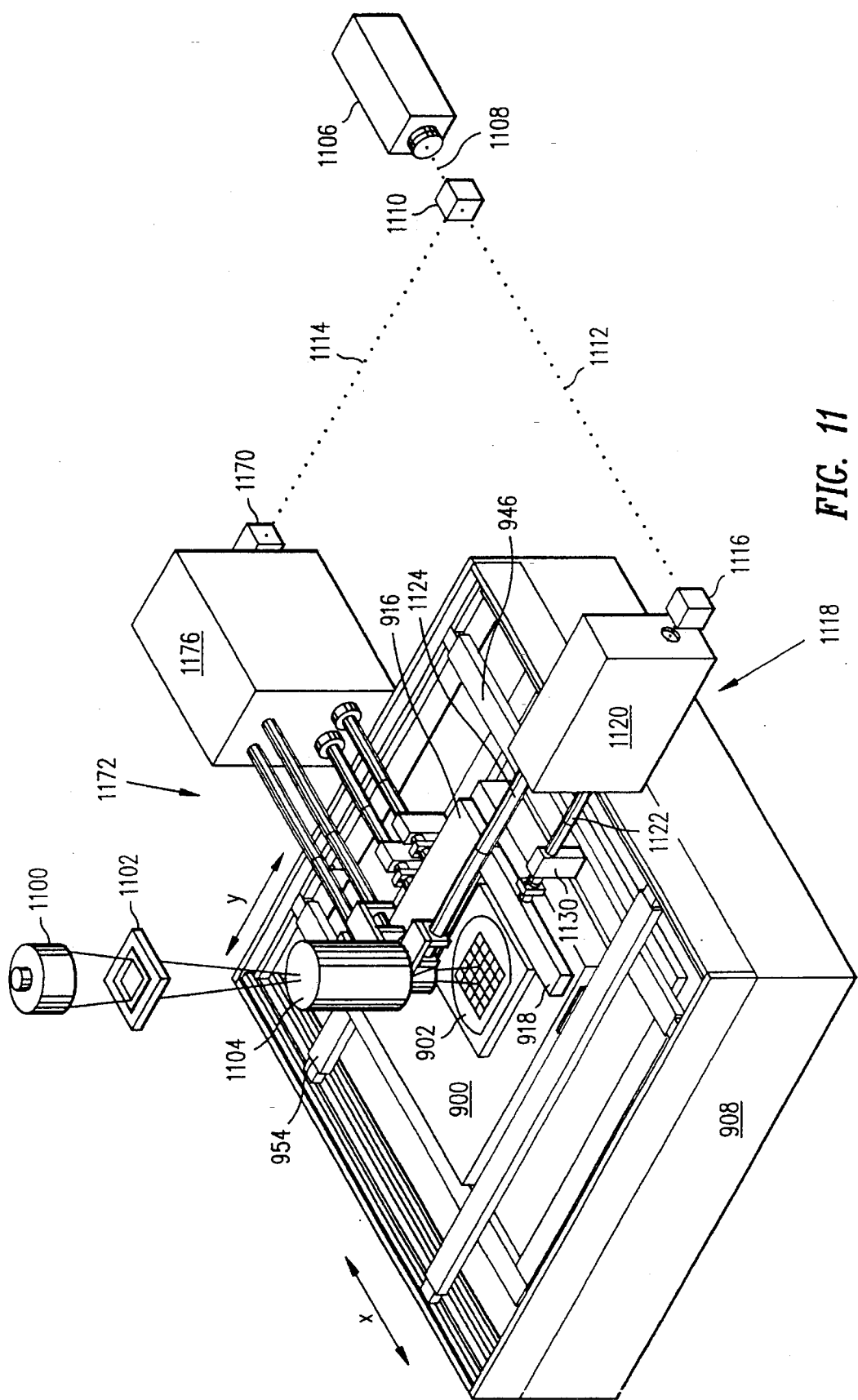
FIG. 11 is a perspective view of a guideless stage having interferometer systems in accordance with the invention.
Figure 12:
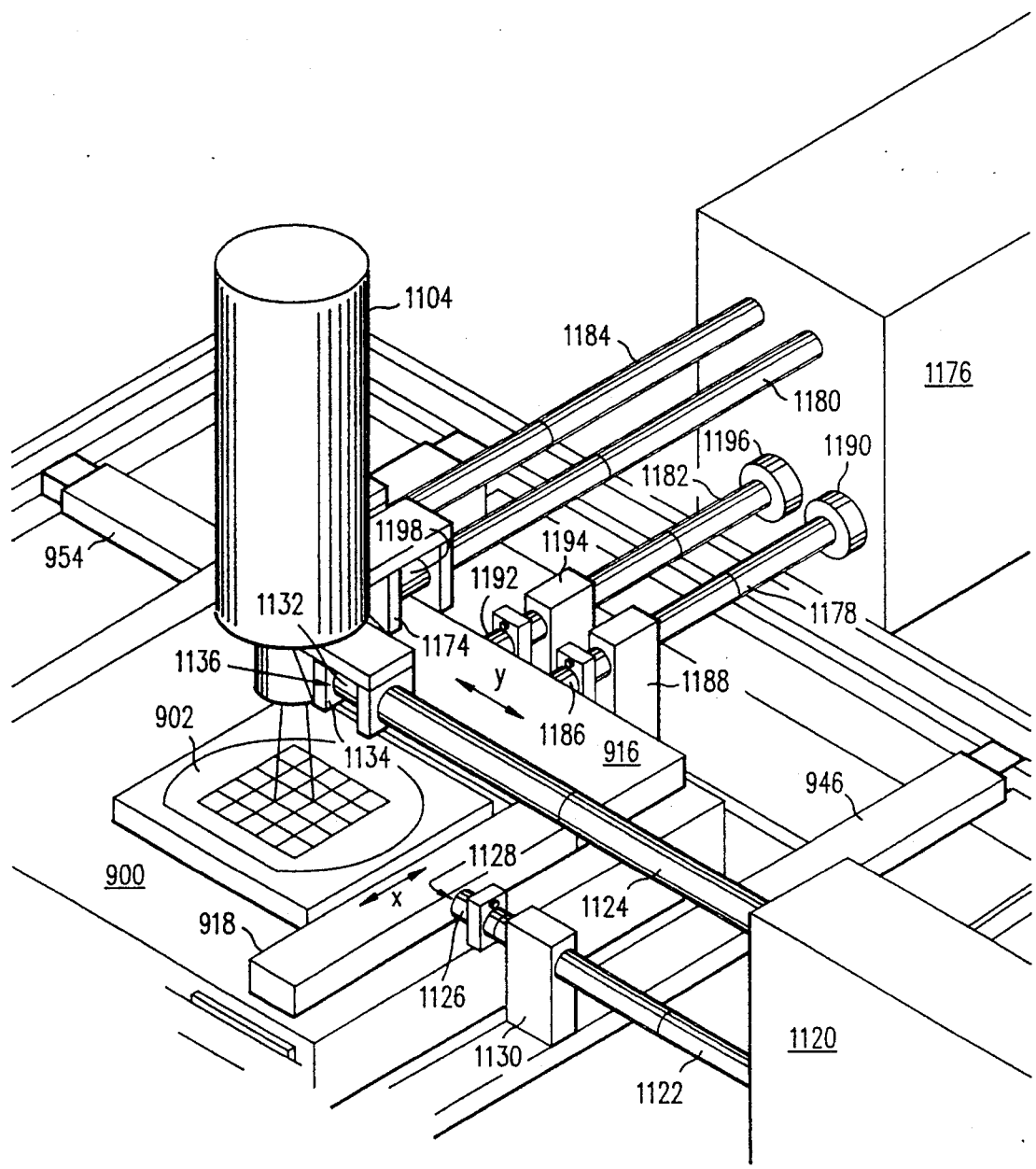
FIG. 12 is an enlarged-scale view showing details of a portion of FIG. 11.

FIGS. 11–12 show such a guideless stage to which interferometers with sheaths have been added in accordance with the invention. Movement of stage 900 is to be controlled for positioning a wafer 902 relative to an optical image produced by a light source 1100, a reticle 1102 and a projection lens assembly 1104 in a wafer exposure system. Source 1106 produces a laser beam 1108 which is split by a splitter 1110 into beams 1112 and 1114.

Beam 1112 is supplied via a mirror 1116 to a Y-axis interferometer system 1118 having a Y-axis measurement laser beam directed at mirror 918 of stage 900 and a reference laser beam directed at a mirror on lens assembly 1104. A laser sheath assembly is provided having a housing 1120, a movable sheath portion 1122 and a fixed sheath portion 1124. As shown in FIG. 12, movable sheath portion 1122 encloses the path of the Y-axis measurement laser beam up to a window 1126 which is spaced from mirror 918 by an air gap 1128. Movable sheath portion 1122 is affixed to arm 946 of the Y follower by a mounting block 1130 and enters housing 1120 through a sliding seal so that movable sheath portion 1122 extends and retracts as the Y follower is moved. Movable sheath portion 1122 is carried by Y-follower arm 946 and thus does not require a separate stage follower motor. Variations in air gap 1128 can occur due to follower error (variation in the distance at which the Y follower follows stage 900. These variations are small and are readily compensated as described above. Fixed sheath portion 1124 encloses the path of the Y-axis reference laser beam up to a window 1132 which is spaced from a mirror 1134 on lens assembly 1104 by an air gap 1136. Housing 1120, sheath portion 1124 and lens assembly 1104 are fixed. Air gap 1136 thus remains constant and is set equal to the nominal air gap 1128 so the Y-axis reference laser beam is subjected to virtually the same optical-path influences as is the Y-axis measurement laser beam.

Beam 1114 is supplied via a mirror 1170 to an X-axis interferometer system 1172 having dual interferometers spaced apart along the X axis for determining position and yaw (rotation) of stage 900. A first X-axis reference laser beam is directed at mirror 916 and a first X-axis measurement laser beam is directed at a mirror 1174 on lens assembly 1104. A second X-axis reference laser beam is directed at mirror 916 and a second X-axis measurement laser beam is directed at a mirror (not shown) on lens assembly 1104. An X-axis laser sheath includes a housing 1176, a movable sheath portion 1178, a fixed sheath portion 1180, a movable sheath portion 1182 and a fixed sheath portion 1184.

Movable sheath portion 1178 encloses the path of the first X-axis measurement laser beam up to a window 1186 which is spaced from mirror 916 by an air gap (not shown). Movable sheath portion 1178 is affixed to arm 954 of the X follower by a mounting block 1188 and enters housing 1176 through a sliding seal 1190 so that movable portion 1178 extends and retracts as the X follower is moved. Movable sheath portion 1182 encloses the path of the second X-axis measurement laser beam up to a window 1192 which is spaced from mirror 916 by an air gap (not shown). Movable sheath portion 1182 is affixed to arm 954 of the X follower by a mounting block 1194 and enters housing 1176 through a sliding seal 1196 so that movable sheath portion 1182 extends and retracts as the X follower is moved. Movable sheath portions 1178 and 1182 are carried by X-follower arm 954 and thus do not require a separate stage follower motor. Variations in air gaps between mirror 916 and windows 1186 and 1192 are small, and result only from X follower error (variation in the distance at which the X follower follows stage 900). Fixed sheath portion 1180 encloses the path of the first X-axis reference laser beam up to a window 1198 which is spaced from mirror 1174 by an air gap (not shown). Housing 1176, sheath portion 1180 and assembly 1104 are fixed. The air gap between window 1198 and mirror 1174 thus remains constant and is set equal to the nominal air gap between window 1186 and mirror 916 so the X-axis reference laser beam is subjected to virtually the same optical-path influences as is the X-axis measurement laser beam. A second Y-axis interferometer can be readily added to the system of FIGS. 11–12, and is useful for calibration and redundancy.

For simplicity, FIGS. 5 and 7 and the above discussion suggest interferometers having a measurement beam which makes a single round trip to the stage mirror. It is preferred, however, to use laser interferometers in which the measurement beam makes two round trips from the interferometer. This provides increased measurement resolution, as a given displacement of the stage mirror produces twice as many interference fringe counts. These are also much less sensitive to misalignment errors. The beams are illustrated as elliptical but could as well be circular. An example of an interferometer system of this type is the HP 5527B laser interferometer positioning system available commercially from Hewlett-Packard Company of Mountain View, Calif., USA. It is possible to use such interferometers in the arrangement of FIGS. 11–12 if the internal cross-sectional dimension of the sheaths is large enough to accommodate multiple beams, e.g., if the internal diameter of each of sheath portions 1122, 1178 and 1182 and of each of sheath portions 1124, 1180 and 1184 is large enough for two beams.

Figure 13:
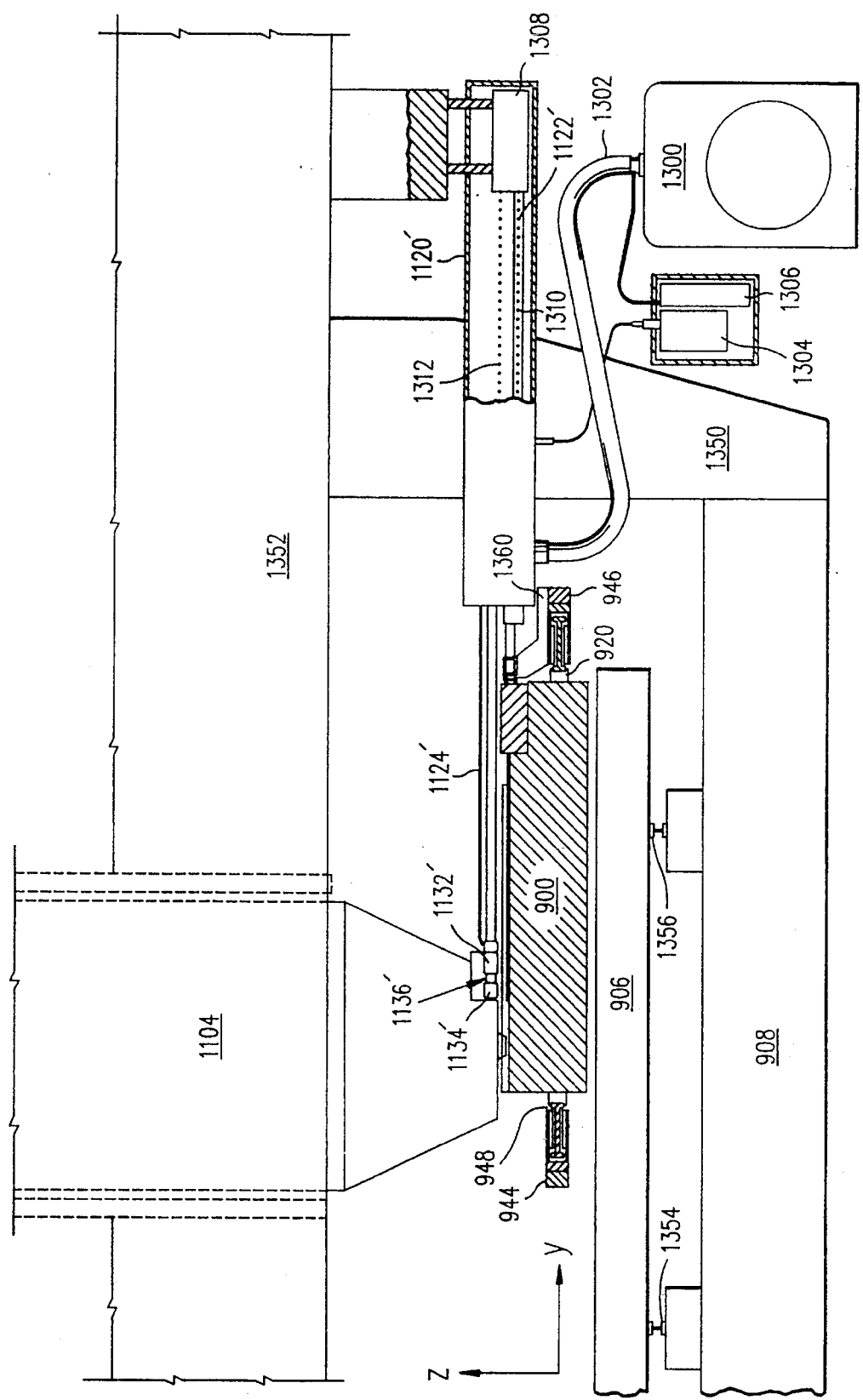
FIG. 13 is a partially cut-away elevation view of a further guideless stage having modified interferometer systems in accordance with the invention.

FIGS. 13–16 show a system similar to that of FIGS. 11–12, modified to have a separate sheath portion for each off our measurement beams and for each of four reference beams in a single axis (e.g., two measurement beams and two reference beams for each of two Y-axis interferometers, to provide high-resolution yaw and position measurement). FIG. 13 is a partially cut-away elevation view showing additional structural elements, in which base 908 is suspended by a plurality of support arms, such as support arm 1350, from an inertial bridge 1352. Inertial bridge 1352 is in turn supported on isolation pads (not shown) and carries projection lens assembly 1104. Air bearing plate 906 is supported on base 908 by a plurality of mounts, such as mount 1354 and mount 1356, which are adjustable in the z-direction to set the elevation and tilt of air bearing plate 906 and thus of stage 900. Stage 900 has openings (not shown) in its lower surface through which pressurized air is released to support stage 900 on a cushion of air above air bearing plate 906. FIG. 13 also shows principal laser-sheath elements. A vacuum pump 1300 is connected by tubing 1302 to a housing 1120'. A pressure sensor 1304 monitors pressure in housing 1120', and a leak-back pressure controller 1306 maintains a constant pressure in housing 1120'. An interferometer 1308 is one of two Y-axis interferometers. One measurement beam 1310 and one reference beam 1312 of interferometer 1308 are shown in FIGS. 13–14. Measurement beam 1310 passes through a movable sheath portion 1122' which is affixed by a support block 1360 to arm 946 of the Y follower. The Y follower is in the far right position in FIGS. 13–14 so that movable sheath portion 1122' is fully retracted. Reference beam 1312 passes within fixed sheath portion 1124' and through window assembly 1132' and air gap 1136' to mirror 1134' on lens assembly 1104.

As seen more clearly in the enlarged-scale sectional view of FIG. 14, fixed sheath portion 1124' is mounted in an opening 1400 of housing 1120' with a seal 1405. Movable sheath portion 1122' is mounted in a bearing assembly 1410 which passes through the wall of housing 1120' and which allows free axial movement of sheath portion 1122'. Window 1126' is affixed to and travels with block 1360 as arm 946 moves. The window end 1415 of movable sheath portion 1122' is coupled by a flexible joint 1420 (e.g., of molded urethane) to a nipple 1425 fitted to block 1360, allowing movable sheath portion 1122' to align itself within bearing 1410. Also shown in FIG. 14 are proximity sensors 1430 and 1435 for measuring air gap 1128'.

Figure 15:
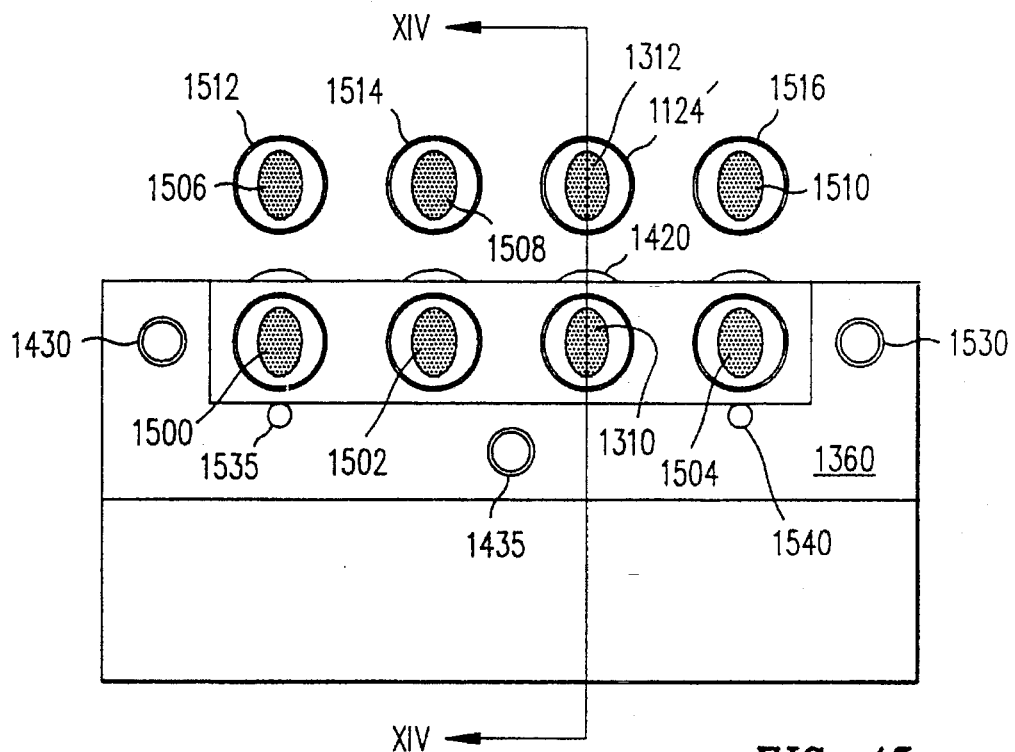
FIG. 15 is a sectional view taken along line XV—XV of FIG. 14.

FIG. 15 is a sectional view taken along line XV—XV of FIG. 14, showing a vertical face of block 1360 with four measurement beams 1500, 1502, 1310 and 1504, with four reference-beams 1506, 1508, 1312 and 1510 housed in respective fixed-sheath portions 1512, 1514, 1124' and 1516, with three proximity sensors 1430, 1435 and 1530, and with two air-gap temperature sensors 1535 and 1540. Multiple proximity sensors and temperature sensors allow precise determination of the air-gap distance and temperature for each measurement beam.

Figure 16:
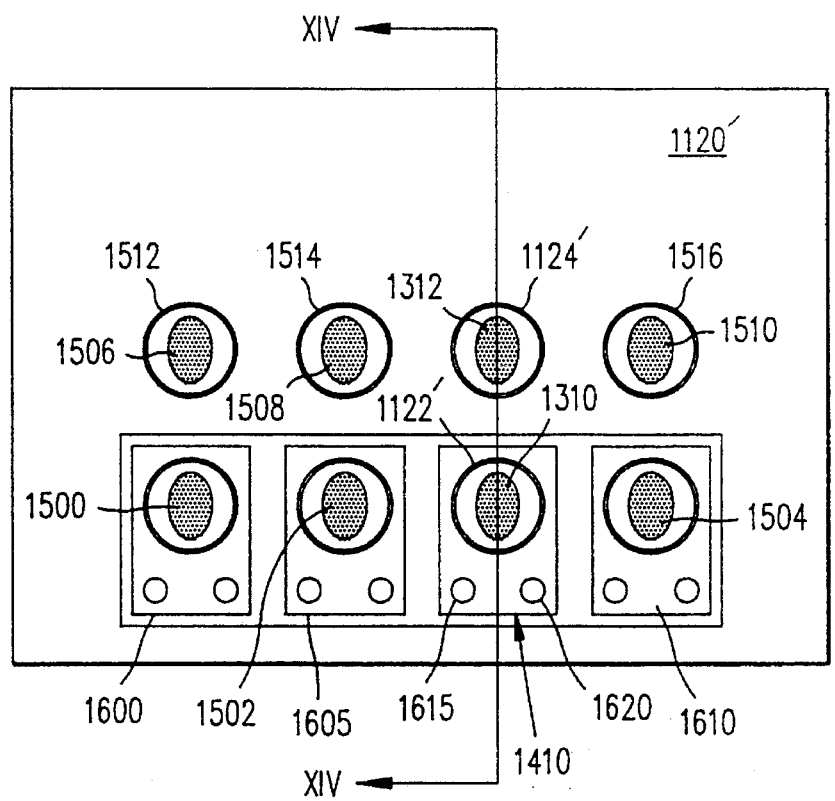
FIG. 16 is a sectional view taken along line XVI—XVI of FIG. 14.

FIG. 16 is a sectional view taken along line XVI—XVI of FIG. 14, showing a vertical face of housing 1120'. Bearing 1410 supports movable sheath portion 1122' in the wall of housing 1120'. Similarly, bearings 1600, 1605 and 1610 support respective movable sheath portions of measurement beams 1500, 1502 and 1504. Bearings 1410, 1600, 1605 and 1610 are preferably air bearings, each having a pressure input and a vent, such as pressure input 1620 and vent 1615 of bearing 1410.

FIG. 17 shows bearing 1410 in an enlarged cross-sectional elevation view taken through line XVII—XVII of FIG. 18. FIG. 18 shows bearing 1410 in an enlarged end view taken as in FIG. 16, but with movable sheath portion 1122' removed. Bearings 1600, 1605 and 1610 are of identical construction. Bearing 1410 is mounted in an opening in the wall of housing 1120' with a flexible sealing material 1700 (e.g., of Devcon) which allows bearing 1410 to align itself with the axis of movable sheath portion 1122'. Air is supplied under pressure to input opening 1620 and passes via a manifold 1780 and bores 1755, 1760, 1765 and 1770 into the annular space between bearing 1410 and movable sheath portion 1122'. Air returns to vent 1615 via annular grooves 1725, 1730 and 1735, longitudinal grooves 1740, 1745 and 1750, and bores 1710, 1715 and 1720. With movable sheath portion 1122' in place, air flows between the outer surface of movable sheath portion 1122' and the inner surface of bearing 1410 to provide support with free axial movement within bearing 1410. The flow of air is indicated by arrows in FIGS. 17 and 18. Most of the air flow is recovered via vent 1615; the small amount which leaks to housing 1120' is negligible with respect to the capacity of the vacuum pump.

Figure 19:
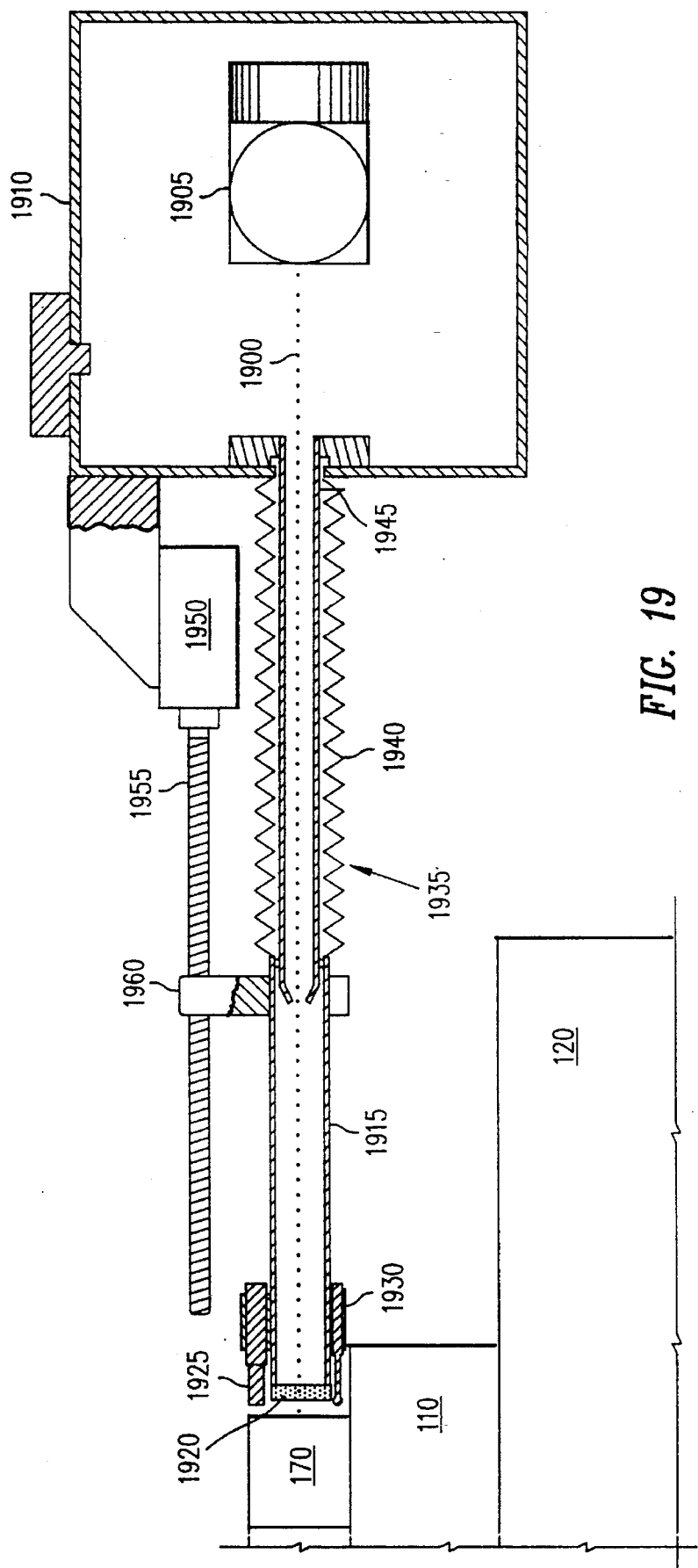
FIG. 19 is a partially cut-away elevation view of a further arrangement for measuring controlling stage position in accordance with the invention.

Other arrangements within the spirit and scope of the invention can be used to maintain the path of the measurement laser beam largely within a controlled environment. FIG. 19 shows an example in which measurement beam 1900 of an interferometer 1905 is enclosed in a sheath comprising a housing 1910, a tube 1915 which carries a laser window 1920 and a proximity sensor 1925 and temperature sensor 1930, and a supported bellows assembly 1935 connecting tube 1915 to housing 1910. Bellows assembly 1935 includes a bellows 1940 and, preferably, a support tube 1945 which telescopes into movable tube 1915. A motor 1950 drives screw 1955 to move block 1960 for extending and retracting the sheath. For simplicity of illustration, interferometer 1905 is of the type having an internal reference beam. The sheath arrangement of FIG. 19 can also be substituted for the sliding tube arrangements of the embodiments described above.

Figure 20:
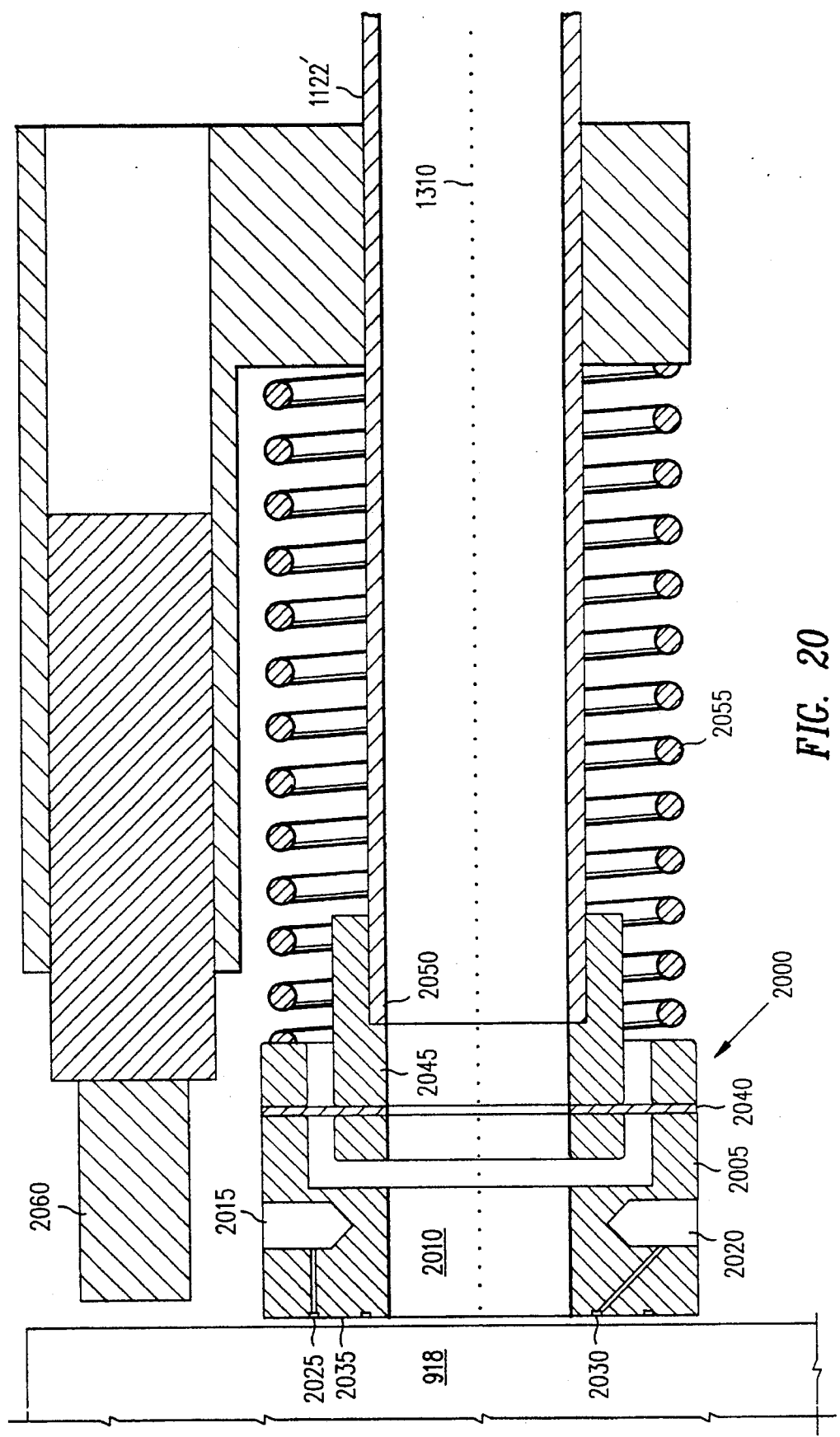
FIG. 20 is a sectional view of a further vacuum sheath embodiment in accordance with the invention.

In the embodiments described above, a window is provided at the stage end of the sheath to maintain the environment in the sheath while avoiding contact with the stage. FIG. 20 shows a modification in accordance with the invention in which movable sheath portion 1122' is fitted at the stage end with a vacuum/air bearing tip 2000 which floats on a cushion of air adjacent mirror 918. A bearing end 2005 has a central bore 2010 through which measurement beam 1310 passes, a pressurized-air inlet 2015 which feeds an annular channel 2025 and a vent outlet 2020 which draws air from annular channel 2030. Air flow from channel 2025 creates an air bearing which keeps face 2035 from contacting mirror 918. Bearing end 2005 is supported by a flexible diaphragm 2040 on a nipple 2045 affixed to tube end 2050. Diaphragm 2040 maintains a vacuum seal between bearing end 2005 and nipple 2045, while allowing bearing end 2005 to be resiliently biased toward mirror 918 by coil spring 2055. Proximity sensor 2060 supplies a signal to control electronics (e.g., as in FIG. 5) so that a stage follower can maintain sensor 2060 at a constant distance from mirror 918. The force of spring 2055 and air pressure to inlet 2015 and venting to outlet 2020 are balanced to allow bearing end 2005 to float as an air bearing a small distance from mirror 918. This arrangement has the advantage that compensation for the air gap and window of the other embodiments is not required. While some air flowing from channel 2025 may leak into movable sheath portion 1122', the amount will be negligible with respect to the vacuum pump capacity and will not materially affect the optical path length of measurement beam 1310.

Figure 21:
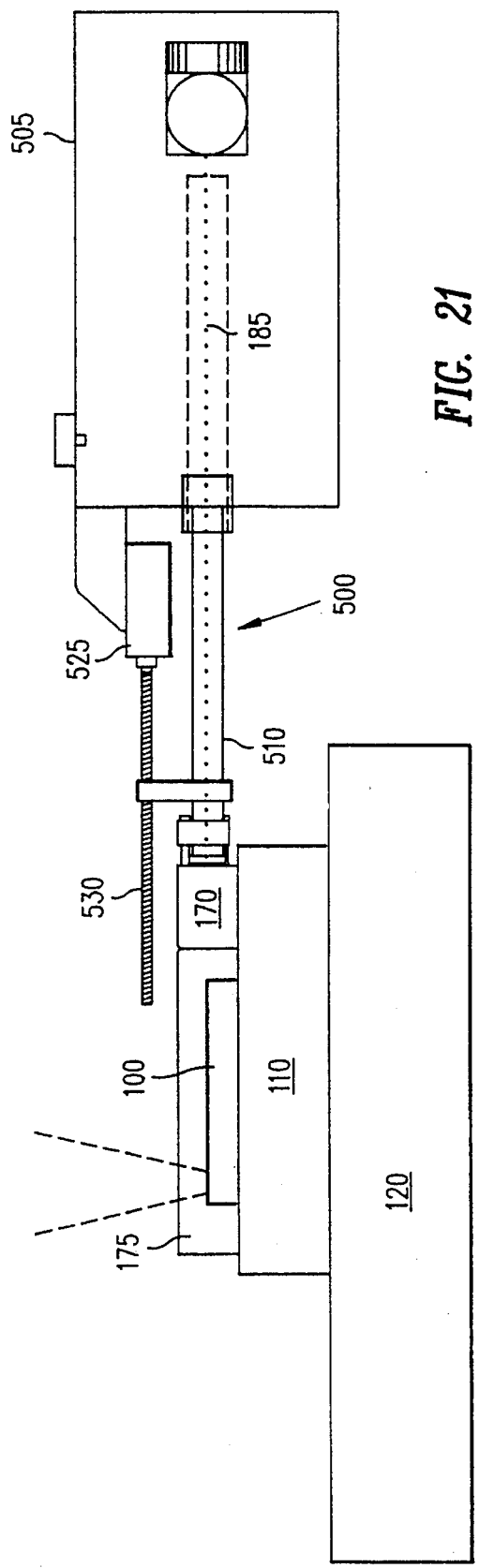
FIG. 21 is a partially cut-away elevation view of an embodiment of the invention comparable to that of FIG. 5, showing horizontal extent of the system along an axis.
Figure 22:
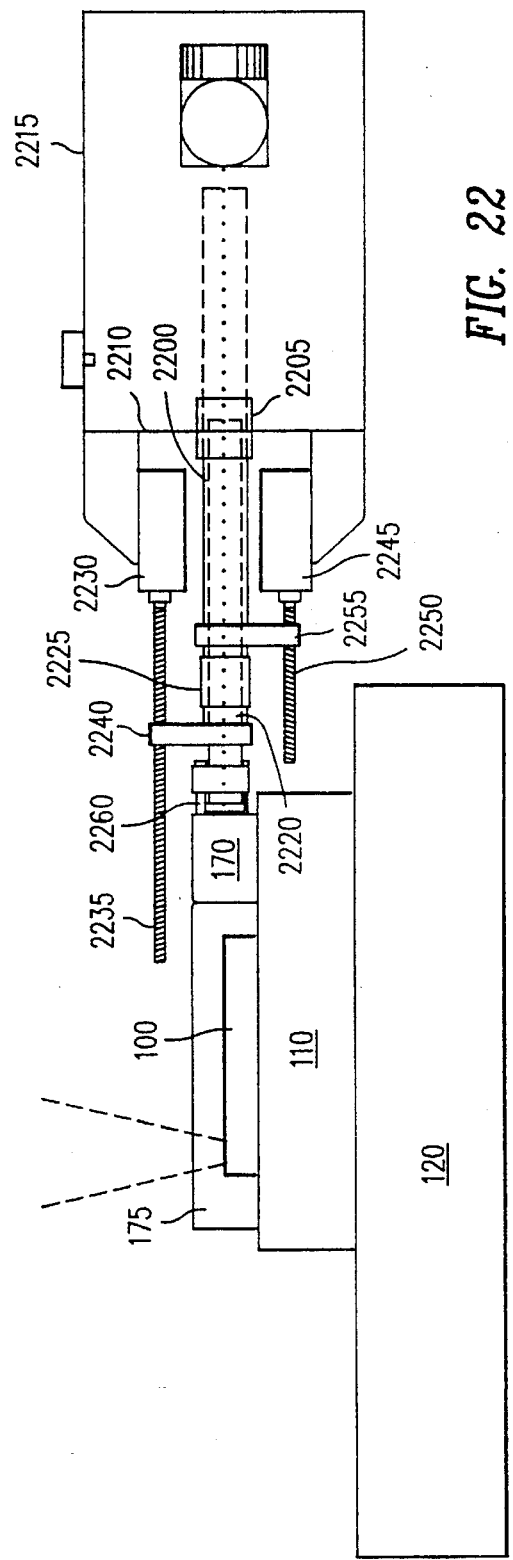
FIG. 22 is a partially cut-away elevation view of an embodiment of the invention modified to reduce the system footprint and showing the laser sheath retracted.
Figure 23:
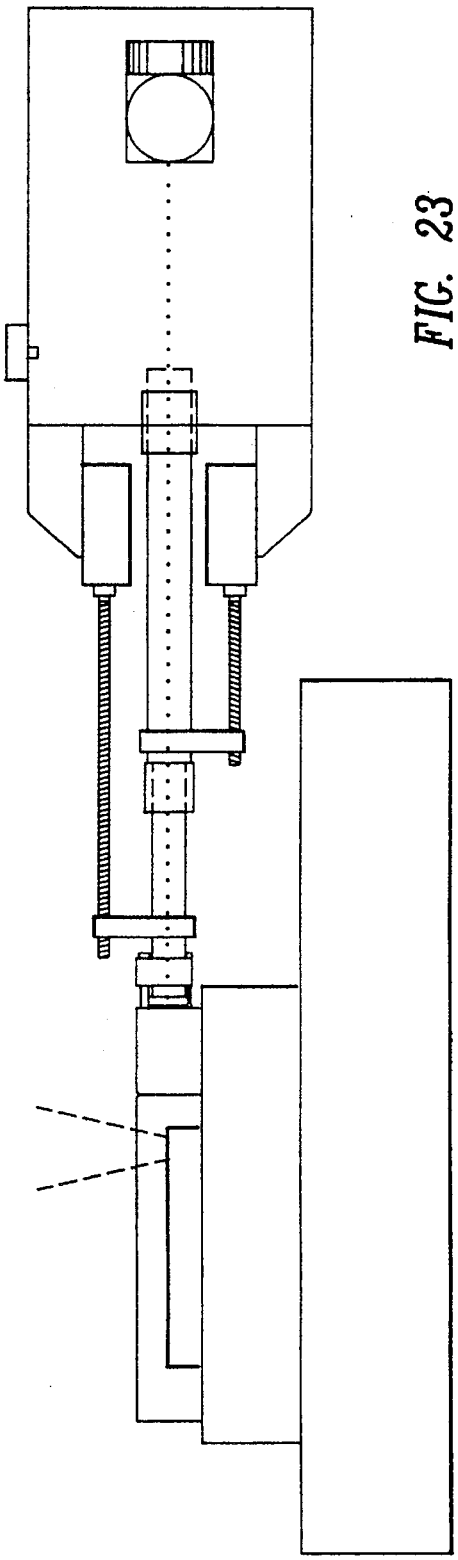
FIG. 23 is a partially cut-away elevation view of the embodiment of FIG. 22 with the laser sheath in an extended position.

It may be desirable in some installations to reduce the overall "footprint" of the system without limiting the travel distance of the stage. FIG. 21 shows the horizontal extent of a single-axis sheath 500 relative to a stage mirror 170 as in the embodiment of FIG. 5. The horizontal extent of the system can be reduced by substituting for single-piece sheath portion 510 a telescoping sheath assembly having multiple tubes which can be retracted as shown in FIG. 22 and extended as shown in FIG. 23. A first tube 2200 is supported for free axial movement in an air-guided bearing 2205 mounted in wall 2210 of housing 2215. A second tube 2220 is supported for free axial movement in an air-guided bearing 2225 at the stage end of first tube 2200. A first follower motor 2245, screw 2250 and support 2255 form a drive system for first tube 2200. A second follower motor 2230, screw 2235 and support 2240 form a drive system for second tube 2220. Motors 2230 and 2245 are controlled in response to the output of a proximity sensor 2260 to maintain the stage end of the telescoping sheath assembly at a fixed distance from stage mirror 170.

Other modifications are also possible. It is an aim of the invention to enclose substantially all the measuring portions of a laser interferometer's measurement path in a common environment, while allowing measurements to be made on the position of a stage which is outside this protected environment. While the embodiments described above enclose the path in a vacuum, other environments can be substituted, such as a well-controlled, gas atmosphere. For example, FIG. 24 shows a modified version of the arrangement of FIG. 13 in which most of the measurement path is enclosed in a helium-gas-filled sheath.

A helium environment has a number of advantages relative to an air environment. Helium has one-eighth the index of refraction relative to a vacuum as does air, reducing environmentally-related error-causing disturbances such as variations in temperature, pressure and humidity. In addition, helium has higher thermal conductivity, so thermal gradients and temperature fluctuations are expected to be much smaller. A gas environment also has some advantages relative to a vacuum environment. Mechanical forces caused by pressure differential between the sheath environment and the atmospheric environment are reduced, thus reducing the design requirements of elements such as window 1132'. A gas environment can also help with transmission of heat generated by the optical system.

Changing the described vacuum-sheath systems to gas-sheath systems raises several issues. First, it is desired to maintain gas density (temperature, pressure, humidity and homogeneity of gas composition) reasonably uniform over the measurement path and, preferably, throughout the sheath. This can be done by providing a system for recirculating the gas within the sheath and compensators such as a local-pressure buffer and a weighted volume monitor for maintaining gas pressure within the sheath. Second, it is preferable to maintain the gas pressure above atmospheric pressure to minimize entry of air which would contaminate the gas, but only slightly above atmospheric pressure to minimize gas leakage from the sheath. The sheath pressure can be, for example, just one psi or so greater than atmospheric. Sheath overpressure and leakage are particularly important with sliding seals (such as the air-bearing seal of FIG. 17). A gas-supply source can accommodate leakage. Third, it is preferable to monitor properties of the gas environment using, for example, a wavelength tracker which provides a compensation signal to the measurement-correction electronics.

Figure 24:
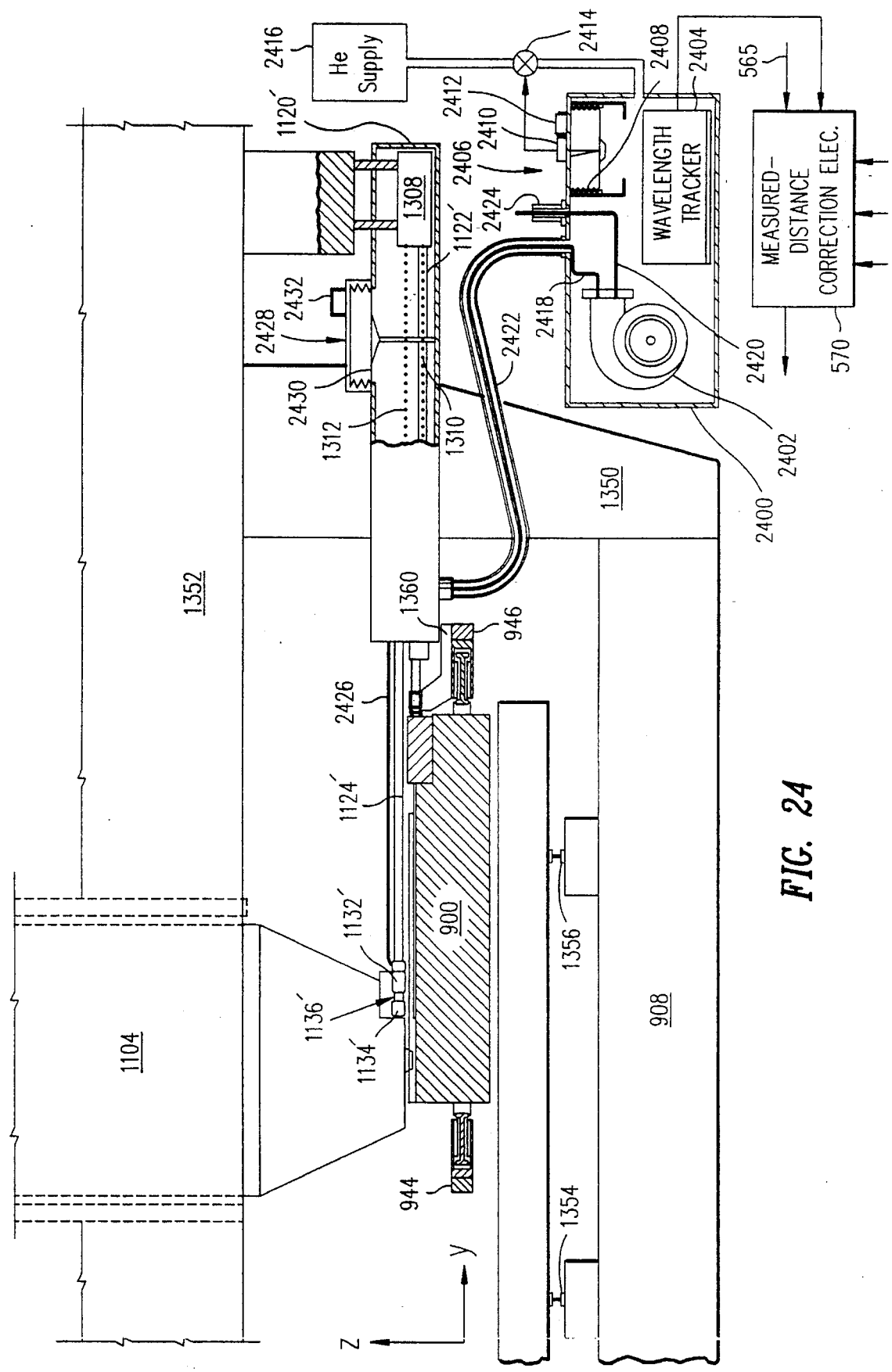
FIG. 24 is a partially cut-away elevation view of a guideless stage having a gas-filled laser sheath in accordance with the invention.

Referring to FIG. 24, a helium chamber 2400 encloses a low-pressure circulation fan 2402, a wavelength tracker 2404, and a pressure/volume controller 2406. Wavelength tracker 2404 can be any suitable unit, such as a model HP 10717A tracker available commercially from Hewlett-Packard Co., supplying a further correction signal to measured-distance correction electronics 570. Pressure/volume controller 2406 is of any suitable design; as schematically illustrated in FIG. 24, it comprises a weighted diaphragm assembly 2408, a volume-level detector 2410, and a vent 2412 to atmosphere. Detector 2410 controls a controllable valve 2414 to allow gas to enter chamber 2400 from a helium-supply container 2416 as needed to replenish the chamber.

Flexible umbilical tubes convey gas from fan 2402 to the housings of the stage's interferometer sheaths and from these housings back to chamber 2400. As shown, flexible tube 2418 conveys helium from fan 2402 to housing 1120', and a flexible tube 2420 conveys helium to the housings of other sheaths (e.g., X-axis sheaths not shown in FIG. 24). A tube 2422, through which tube 2418 passes, is of sufficiently large diameter to provide a return path for helium from housing 1120' to chamber 2400. Similarly, a tube 2424, through which tube 2420 passes, provides a return path for helium from the housings of the other sheaths. Tube 2418 branches within chamber 1120' to supply helium via a recirculation tube 2426 to the distal end of fixed sheath portion 1124', so that helium within fixed sheath portion 1124' is continuously refreshed along the reference beam path. It is also preferable to branch tube 2418 within chamber 1120' to supply helium via a recirculation tube or channel (not shown) passing within movable sheath portion 1122' to the distal end of movable sheath portion 1122' so that helium flow is also maintained along the measurement beam path. Movable sheath portion 1122' and the recirculation tube or channel (not shown) which delivers gas to the distal end of movable sheath portion 1122' are designed so as not to interfere with the measurement beam. The volume of the sheath changes as movable sheath portion 1122' extends and retracts with movement of stage 900. To minimize pressure variations which could affect the measured optical path length, these volume changes are compensated by a local volume buffer 2428 having a spring-loaded diaphragm 2430 and a vent 2432 to atmosphere so that the upper surface of diaphragm 2430 is exposed to atmospheric pressure, the same pressure to which vent 2412 is exposed.

Maintaining one environment (temperature, pressure, humidity) for all laser interferometer measurement paths in the system improves accuracy and stability of distance measurements. Having the same controlled environment for all interferometers of a system also enables smaller relative measurement errors between interferometers. With such a system, the design of air handling in the vicinity of the laser interferometers is not constrained by laser measurement issues because the measurement paths are enclosed. Outside sources of turbulence, temperature variation, humidity, etc., thus do not interfere with the measuring function of the interferometer.

The embodiments described apply the inventive concepts to two different types of stage structure: a conventional stage to which followers are added for positioning the movable sheath portions (e.g., as in FIG. 8), and a guideless stage already having followers to which the movable sheath portions can be attached (e.g., as in FIG. 11 ). Laser sheaths in accordance with the invention can be applied to other stage structures as well. Consider, for example, the stage structure disclosed in U.S. patent application Ser. No. 08/325,740 filed Oct. 19, 1994 of T. Novak et al. entitled "Precision Motion Stage with Single Guide Beam and Follower Stage," the content of which is incorporated herein by this reference. The latter stage structure has a stage follower in the X direction and has no follower in the Y direction. In such a "hybrid" stage structure, a laser sheath for the X axis interferometer can have a movable sheath portion attached to the existing stage follower (e.g., as in FIG. 11). A follower can be added (e.g., as in FIG. 8) for keeping a movable sheath portion of the laser sheath for the Y axis interferometer at a constant distance from the stage.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

We claim:

1. Apparatus for measuring position of an XY stage, comprising:

a. a stage movable along mutually-orthogonal X and Y axes, the stage having an X-axis mirror and a Y-axis mirror;

b. a first laser interferometer for directing an X-axis measurement beam along an X-axis beam path toward the X-axis mirror and for producing a first measured-distance signal indicative of an optical path length between the first laser interferometer and the X-axis mirror;

c. a sheath enclosing the X-axis measurement beam along substantially the entire X-axis beam path to define a volume of controlled environment for the X-axis measurement beam, the sheath including an X-axis sheath portion having an effective length which varies in response to a follower system as the X-axis mirror changes position;

d. a second laser interferometer for directing a Y-axis measurement beam along a Y-axis beam path toward the Y-axis mirror and for producing a second measured-distance signal indicative of an optical path length between the second laser interferometer and the Y-axis mirror;

e. a sheath enclosing the Y-axis measurement beam along substantially the entire Y-axis beam path to define a volume of controlled environment for the Y-axis measurement beam, the sheath including a Y-axis sheath portion having an effective length which varies in response to a follower system as the Y-axis mirror changes position;

f. an X-axis follower system for varying the effective length of the X-axis sheath portion so that substantially the entire X-axis beam path remains enclosed as the X-axis mirror changes position relative to the first laser interferometer, wherein the X-axis follower system comprises a follower which follows movement of the stage while remaining out of contact with the stage, and wherein an end of the X-axis sheath portion nearest the X-axis mirror is mounted for movement with the follower such that said end of the X-axis sheath remains at a substantially constant spacing from the X-axis mirror; and g. a Y-axis follower system for varying the effective length of the Y-axis sheath portion so that substantially the entire Y-axis beam path remains enclosed as the Y-axis mirror changes position relative to the second laser interferometer.

2. The apparatus of claim 1, further comprising:

h. an environmental control system for controlling the environment within the sheaths.

3. The apparatus of claim 2, further comprising a correction system for detecting environmental characteristics of the Y-axis beam path and for compensating the second measured-distance signal in response to the detected environmental characteristics to produce a second corrected signal indicative of actual distance between the second laser interferometer and the Y-axis mirror.

4. The apparatus of claim 1, further comprising a correction system for detecting environmental characteristics of the X-axis beam path and for compensating the first measured-distance signal in response to the detected environmental characteristics to produce a first corrected signal indicative of actual distance between the first laser interferometer and the X-axis mirror.

5. The apparatus of claim 1, wherein the Y-axis follower system comprises a follower which follows movement of the stage while remaining out of contact with the stage, and wherein an end of the Y-axis sheath portion nearest the Y-axis mirror is mounted for movement with the follower such that said end of the Y-axis sheath remains at a substantially constant spacing from the Y-axis mirror.

6. Apparatus for measuring position of a stage movable along mutually-orthogonal first and second axes, the stage having a first reflector substantially normal to the first axis, comprising:

a. a first-axis laser interferometer for directing a first-axis measurement beam along a first beam path parallel to the first axis toward the first reflector and for producing a measured-distance signal indicative of an optical path length between the first-axis laser interferometer and the first reflector;

b. a first-axis follower system having a first-axis follower which follows movement of the stage along the first axis while remaining out of contact with the stage; and c. a first-axis sheath enclosing the first-axis measurement beam along a substantial part of the first beam path to define a volume of controlled environment for the first-axis measurement beam, the first-axis sheath including a movable sheath portion carried by the follower such that the sheath has an effective length which varies with movement of the stage along the first axis while remaining out of contact with the stage.

7. The apparatus of claim 6, wherein the first-axis follower maintains an end of the first-axis sheath at a substantially constant spacing from the first reflector.

8. The apparatus of claim 7, wherein the stage has a second reflector substantially normal to the second axis, further comprising:

d. a second-axis laser interferometer for directing a second-axis measurement beam along a second beam path parallel to the second axis toward the second reflector and for producing a measured-distance signal indicative of an optical path length between the second-axis laser interferometer and the second reflector;

e. a second-axis follower system having a second-axis follower which follows movement of the stage along the second axis while remaining out of contact with the stage; and f. a second-axis sheath enclosing the second-axis measurement beam along a substantial part of the second beam path to define a volume of controlled environment for the second-axis measurement beam, the second-axis sheath including a movable sheath portion carried by the follower such that the second-axis sheath has an effective length which varies with movement of the stage along the second axis while remaining out of contact with the stage.

9. The apparatus of claim 8, wherein the second-axis follower maintains an end of the second-axis sheath at a substantially constant spacing from the second reflector.

10. The apparatus of claim 7, further comprising an environmental controller for controlling the environment within the first-axis sheath.

11. The apparatus of claim 7, further comprising a corrector for detecting environmental characteristics of the first beam path and for compensating the measured-distance signal in response to the detected environmental characteristics to produce a corrected signal indicative of actual distance between the first-axis laser interferometer and the first reflective surface.

12. The apparatus of claim 11, wherein the first-axis sheath portion comprises a housing enclosing a portion of the first beam path, the housing having a wall and a beam opening through the wall, wherein the first-axis sheath portion comprises an elongate hollow member extending through the beam opening and supported for movement relative to the wall in a direction generally parallel to the first beam path, and wherein the first-axis sheath portion further comprises a window covering an end of the elongate hollow member nearest the first reflector, the window allowing passage of the first-axis measurement beam between the controlled environment and the first reflector.

13. The apparatus of claim 12, wherein the follower varies the effective length of the sheath portion by displacing the elongate hollow member along the first beam path to maintain the window at a substantially constant distance from the first reflector.

14. The apparatus of claim 12, further comprising a gap sensor for measuring distance between the window and the first reflector and wherein the corrector is responsive to the gap sensor for compensating the measured-distance signal in dependence on measured distance between the window and the reflector.

15. The apparatus of claim 14, further comprising a temperature sensor for detecting atmospheric temperature in the region of a gap between the window and the reflective surface and wherein the corrector is responsive to the temperature sensor for compensating the measured-distance signal in dependence on the detected atmospheric temperature.

16. The apparatus of claim 12, further comprising a pressure sensor for detecting pressure within the controlled environment and wherein the corrector is responsive to the pressure sensor for compensating the measured-distance signal in dependence on the detected pressure.

17. The apparatus of claim 12, wherein the window has an index of refraction which differs from the index of refraction of the controlled environment, and wherein the corrector compensates the measured-distance signal for the optical path length of the window.

18. The apparatus of claim 11, wherein the first-axis sheath is filled with a gas, and further comprising a wavelength tracker for monitoring optical properties of the gas and for supplying a correction signal to said corrector.

19. The apparatus of claim 7, wherein the first-axis sheath comprises a housing enclosing a portion of the first beam path, the housing having a wall and a beam opening through the wall, and wherein the sheath portion comprises an elongate hollow member extending through the beam opening and supported for movement relative to the wall in a direction generally parallel to the first beam path.

20. The apparatus of claim 19, further comprising an air-guided bearing for supporting the sheath portion in the beam opening.

21. The apparatus of claim 19, wherein an end of the elongate hollow member nearest the reflector is fitted with a bearing for maintaining the sheath portion at a substantially fixed spacing from the reflector.

22. The apparatus of claim 21, wherein the bearing comprises a tip end having a face resiliently biased toward the reflector and having at least one channel for expelling pressurized gas to maintain separation between the face and the reflector.

23. The apparatus of claim 6, wherein the first-axis sheath comprises a housing enclosing a portion of the first beam path, the housing having a wall and a beam opening through the wall, and wherein the sheath portion comprises a telescoping assembly of elongate hollow members, the assembly extending through the beam opening and mounted for movement relative to the wall in a direction generally parallel to the first beam path.

24. The apparatus of claim 6, wherein the sheath comprises a housing enclosing a portion of the beam path, the housing having a wall and a beam opening through the wall, and wherein the sheath portion comprises an elongate hollow member having a bellows of variable length, the sheath portion mounted in the opening for extension and retraction relative to the wall in a direction generally parallel to the beam path.

25. The apparatus of claim 6, wherein the environmental controller comprises a vacuum pump for evacuating the first-axis sheath and pressure controller for maintaining pressure within the first-axis sheath within predetermined limits.

26. The apparatus of claim 6, wherein the first-axis sheath is filled with a gas.

27. The apparatus of claim 26, further comprising means for recirculating gas within the first-axis sheath to maintain a substantially uniform gas density within the first-axis sheath.

28. The apparatus of claim 26, further comprising means for maintaining a substantially constant gas pressure within the first-axis sheath.

29. The apparatus of claim 6, wherein the first-axis sheath is filled with helium.

* * * * *